(12) United States Patent
Black et al.

(10) Patent No.: US 12,302,516 B2
(45) Date of Patent: May 13, 2025

(54) GLASS ARTICLE FOR VEHICLE INTERIOR SYSTEM HAVING A BENDABLE DISPLAY UNIT

(71) Applicant: CORNING INCORPORATED, Corning, NY (US)

(72) Inventors: Matthew Lee Black, Naples, NY (US); Jordon Thomas Boggs, Middlebury Center, PA (US); Matthew John Cempa, Tyrone, PA (US); Kevin Thomas Gahagan, Painted Post, NY (US); Evan Gray Kister, Painted Post, NY (US); Balamurugan Meenakshi Sundaram, Painted Post, NY (US); David Evan Robinson, Corning, NY (US); Jason Scott Stewart, Hornell, NY (US)

(73) Assignee: CORNING INCORPORATED, Corning, NY (US)

( * ) Notice: Subject to any disclaimer, the term of this patent is extended or adjusted under 35 U.S.C. 154(b) by 274 days.

(21) Appl. No.: 18/021,072

(22) PCT Filed: Aug. 10, 2021

(86) PCT No.: PCT/US2021/045301
§ 371 (c)(1),
(2) Date: Feb. 13, 2023

(87) PCT Pub. No.: WO2022/039969
PCT Pub. Date: Feb. 24, 2022

(65) Prior Publication Data
US 2023/0328907 A1 Oct. 12, 2023

Related U.S. Application Data

(60) Provisional application No. 63/067,526, filed on Aug. 19, 2020.

(51) Int. Cl.
*H05K 5/02* (2006.01)
*B60K 35/00* (2006.01)
*B60K 35/22* (2024.01)

(52) U.S. Cl.
CPC .......... *H05K 5/0226* (2013.01); *B60K 35/00* (2013.01); *B60K 35/223* (2024.01); *B60K 2360/96* (2024.01)

(58) Field of Classification Search
CPC .... H05K 5/0226; B60K 35/00; B60K 35/223; B60K 2360/96; B60K 35/10; B60K 35/28;
(Continued)

(56) References Cited

U.S. PATENT DOCUMENTS 10,175,802 B2 * 1/2019 Boggs ................. B32B 7/12
10,781,127 B2 * 9/2020 Kumar ................. B60K 35/10
(Continued)

FOREIGN PATENT DOCUMENTS

CN 109246963 A 1/2019
DE 102019200396 A1 7/2020
(Continued)

OTHER PUBLICATIONS

International Search Report and Written Opinion of the International Searching Authority; PCT/US2021/045301; dated Oct. 27, 2021; 11 pages; European Patent Office.

*Primary Examiner* — Anthony M Haughton
*Assistant Examiner* — Hung Q Dang
(74) *Attorney, Agent, or Firm* — Daniel J. Greenhalgh

(57) ABSTRACT

A bendable glass article having a bendable display unit is disclosed. The glass article includes a glass sheet including a first major surface and a second major surface opposite to the first major surface. A hinge mechanism is disposed on the second major surface of the glass sheet. The hinge
(Continued)

mechanism divides the glass sheet into a first side and a second side. A bendable display unit is bonded to the second major surface of the glass sheet and disposed between the glass sheet and the hinge mechanism. An adhesive material is disposed on the second major surface of the glass sheet around the display. The first side is bendable about the hinge mechanism relative to the second side, and the bendable display unit is hermetically sealed within the adhesive material.

20 Claims, 11 Drawing Sheets

(58) Field of Classification Search
CPC ........ B60K 35/50; B60K 35/60; B60K 37/20; B60K 2360/693; B60K 35/22; B60Y 2400/92
See application file for complete search history.

(56) References Cited

U.S. PATENT DOCUMENTS

| 11,830,391 | B2* | 11/2023 | Eguchi | H05K 5/0226 |
| 2020/0178404 | A1* | 6/2020 | Um | H05K 5/0017 |

FOREIGN PATENT DOCUMENTS

| JP | 2013-188993 A | 9/2013 |
| WO | 2020/123367 A1 | 6/2020 |

* cited by examiner

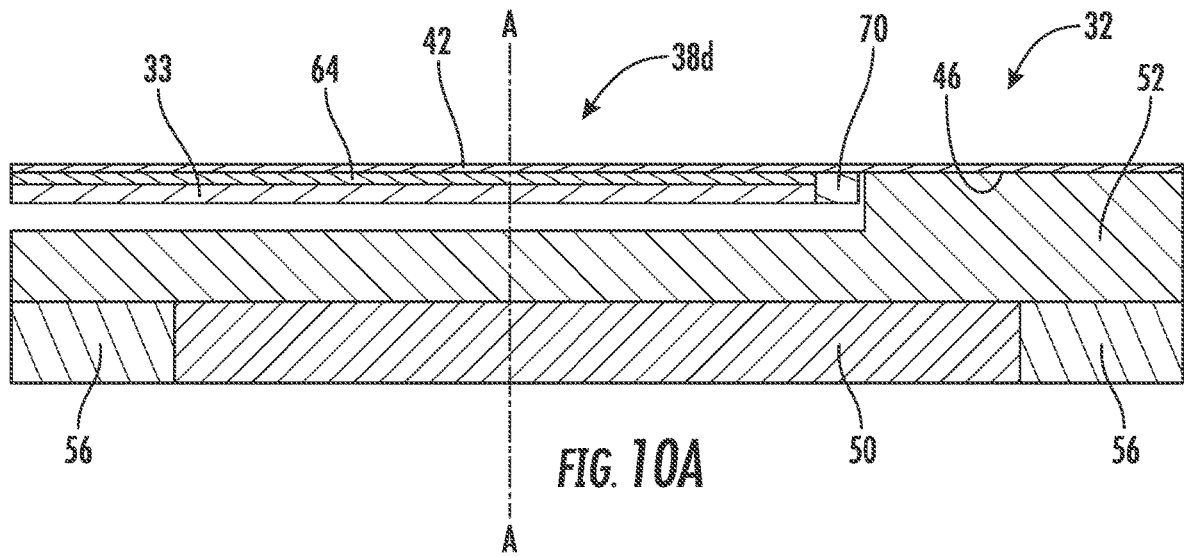
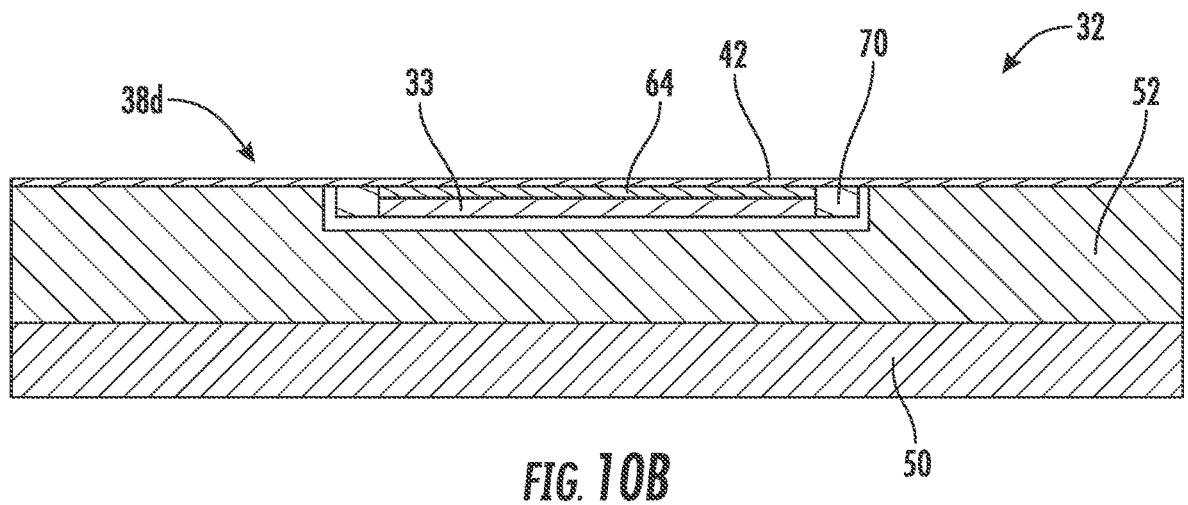

GLASS ARTICLE FOR VEHICLE INTERIOR SYSTEM HAVING A BENDABLE DISPLAY UNIT

This application claims the benefit of priority under 35 U.S.C. § 371 of International Patent Application Serial No. PCT/US2021/045301, filed on Aug. 10, 2021, which claims the benefit of priority under 35 U.S.C. § 119 of U.S. Provisional Application Ser. No. 63/067,526 filed on Aug. 19, 2020, the content of which is relied upon and incorporated herein by reference in its entirety.

BACKGROUND

The disclosure relates generally to glass articles, and more particularly to a bendable glass article for a vehicle interior system having a bendable display unit.

Vehicle interiors include a variety of display screens. Efforts have been made to incorporate such display screens into the overall aesthetic design of the vehicle. In this way, attempts have been made to incorporate the displays into continuous surfaces, e.g., of a dashboard. Further, in order to enhance both the aesthetic design and functionality, glass has been used to form these continuous surfaces. However, the use of the glass provides additional design challenges over other conventional plastic, metal, and composite materials, which have had significant time to develop in the automotive industry.

SUMMARY

According to an aspect, embodiments of the disclosure relate to a glass article. The glass article includes a glass sheet including a first major surface and a second major surface opposite to the first major surface. A hinge mechanism is disposed on the second major surface of the glass sheet. The hinge mechanism divides the glass sheet into a first side and a second side. A bendable display unit is bonded to the second major surface of the glass sheet and disposed between the glass sheet and the hinge mechanism. An adhesive material is disposed on the second major surface of the glass sheet around the display. The first side is bendable about the hinge mechanism relative to the second side, and the bendable display unit is hermetically sealed within the adhesive material.

According to another aspect, embodiments of the disclosure relate to an interior system of a vehicle. The interior system includes a dashboard base positioned across a center line axis of the vehicle. The center line axis divides the vehicle longitudinally into a driver side and a passenger side. A glass article is attached to the dashboard base. The glass article includes a glass sheet having a first major surface and a second major surface opposite to the first major surface. The first glass sheet has a first side and a second side. The first side is located on the driver side of the center line axis. A hinge mechanism is disposed on the second major surface of the glass sheet. The hinge mechanism divides the glass sheet between the first side and the second side. A bendable display unit is bonded to the second major surface of the glass sheet and is disposed between the hinge mechanism and the glass sheet. An adhesive material is disposed on the second major surface of the glass sheet around the bendable display unit. The display is hermetically sealed between the adhesive material and the glass sheet. The bendable display unit is configured to transition between a curved configuration and a planar configuration when the second side of the glass sheet bends about the hinge mechanism.

Additional features and advantages will be set forth in the detailed description which follows, and in part will be readily apparent to those skilled in the art from that description or recognized by practicing the embodiments as described herein, including the detailed description which follows, the claims, as well as the appended drawings.

It is to be understood that both the foregoing general description and the following detailed description are merely exemplary, and are intended to provide an overview or framework to understanding the nature and character of the claims. The accompanying drawings are included to provide a further understanding, and are incorporated in and constitute a part of this specification.

BRIEF DESCRIPTION OF THE DRAWINGS

The accompanying drawings incorporated in and forming a part of the specification illustrate several aspects of the present invention and, together with the description, serve to explain the principles of the invention. In the drawings:

FIGS. 5A-13A depict cross-sectional views of exemplary embodiments of glass articles; and FIGS. 5B-13B depict cross-sectional views of the embodiments of FIG. 5A-13A taken along line A-A in each of FIGS. 5A-13A.

DETAILED DESCRIPTION

Embodiments of the present disclosure relate to a bendable glass article of a vehicle interior system that has a display unit across the bendable region of the glass article. In embodiments, the glass article is configured to incorporate multiple display screens that might be found on a dashboard of a vehicle, such as an infotainment screen, an instrument panel, and a vehicle perimeter camera. One end of the glass article is configured to rotate about a bend axis, e.g., towards the driver of the vehicle to improve visibility of a screen contained thereon. A bendable display screen is provided across the bend axis such that the bendable display screen can be either curved or flat. In order to provide bendability, the bendable display screen is a thin, flexible display, such as an organic light emitting diode (OLED) display. However, incorporating an OLED display into the glass article raises issues with respect to providing adequate sealing for the OLED display and while also avoiding damaging the OLED display as a result of mechanical stresses transferred to the display from the mounting mechanism.

The organic layers in OLED displays are extremely thin, and most OLED displays are based on chemically active materials, which can be easily damaged by exposure to moisture or oxygen in the air. Moreover, thin metal layers used as electrodes are also very sensitive to corrosion. Accordingly, the glass article should provide a hermetic seal for the OLED display, while also providing mechanical reliability for the OLED display.

These and other aspects and advantages will be described in relation to the embodiments discussed below and shown in the figures. These embodiments are presented by way of illustration and not by way of limitation.

Figure 1:
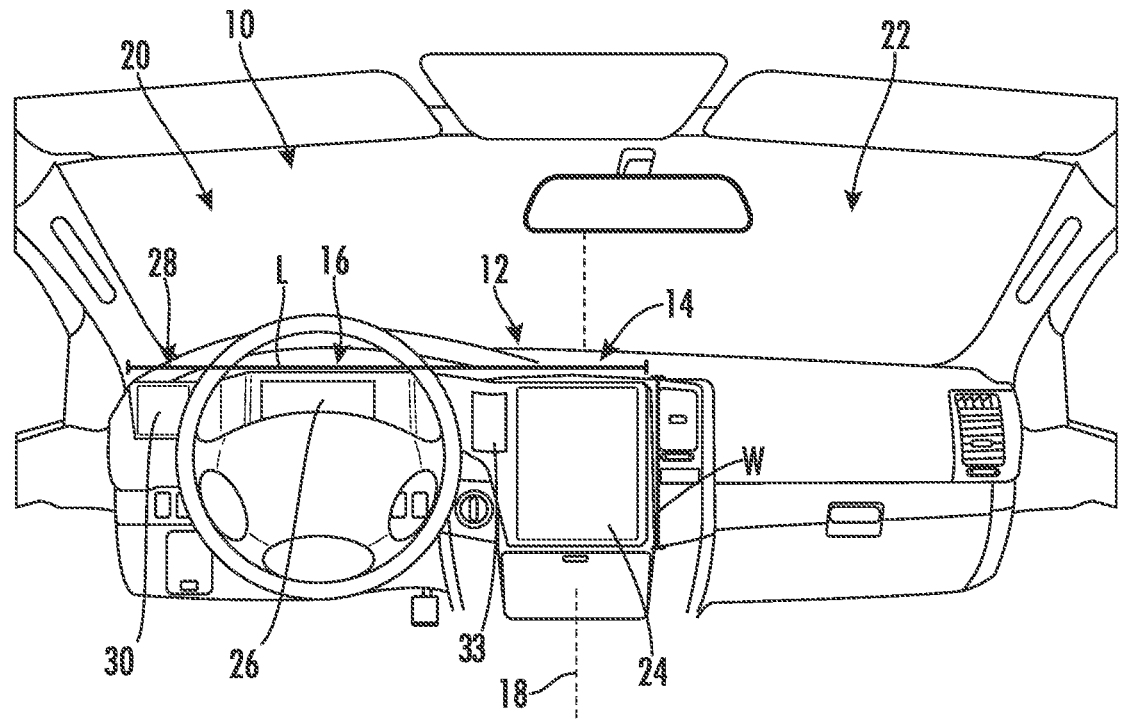
FIG. 1 depicts a vehicle interior including a glass article with a living hinge integrated into a dashboard of the vehicle, according to exemplary embodiments.

FIG. 1 depicts a vehicle interior 10, including a dashboard base 12. In embodiments, the dashboard base 12 includes a center console region 14 and an instrument panel region 16. In general, the dashboard base 12 is disposed across a center line axis 18 of the vehicle. The center line axis 18 divides the vehicle longitudinally between a driver side 20 and a passenger side 22. The instrument panel region 16 is on the driver side 20 of the centerline axis 18, and the center console region 14 may extend across the center line 18 such that the center console region 14 is on both the driver side 20 and the passenger side 22. In embodiments, the center console region 14 includes a first display screen 24, and the instrument panel region 16 includes a second display screen 26. In embodiments, the dashboard base 12 may include one or more additional display regions 28, each including an additional display screen 30. In embodiments, the first display screen 24, the second display screen 26, and the additional display screen 30 may be any one of a plasma display, a light-emitting diode (LED) display, an organic LED (OLED) display, a micro-LED display, or a liquid crystal display (LCD).

In embodiments, the first display screen 24 of the center console region 14 is an infotainment center providing information and a control panel to a driver and/or passenger of the vehicle. For example, the first display screen 24 may display vehicle information, GPS directions, climate controls, audio controls, etc. In embodiments, the second display screen 26 of the instrument panel region 16 may display a speedometer, a fuel gage, a tachometer, a coolant temperature, etc. In embodiments including an additional display screen 30, the additional display screen 30 may display, e.g., views of a front of the vehicle, a rear of the vehicle, or one or more blind spots of the vehicle as captured by a remote camera. In embodiments, the first display screen 24, the second display screen 26, and or additional display screen 30 may be configured as a touch screen.

The first display screen 24, the second display screen 26, and the additional display screen 30 (when included) are all incorporated in the same curved glass article 32. As will be discussed below, the second display screen 26 (and additional screen 30) is fixed to the instrument panel region 14 of the dashboard 12, and the first display screen 24 in the center console region 14 is bendable relative to the second display screen 26. In embodiments, the first display screen 24 bends from a first position in which the first display screen 24 is oriented substantially equally between the driver side 20 and the passenger side 22 to a second position in which the first display screen 24 is oriented towards the driver side 20. In order to allow for bending, the glass article 32 has a free end on the first display screen 24 side.

As will be discussed more fully below, the glass article 32 includes a bendable display unit 33 in the region between the first display screen 24 and second display screen 26 where the glass article 32 bends. A display unit in the bend region of the glass article allows information to be placed at a common focal plane for a viewer (in particular, the driver) to minimize eye strain and improve reaction time. Additionally, information displayed in the bend region increases the available screen area, which may enable displaying of more information, larger font sizes, additional graphics, etc. Still further, graphics on the display may be designed to harmonize with the interior styling of the vehicle. Moreover, in embodiments, while the first display screen 24, second display screen 26, and bendable display unit 33 are described as being separate display modules, the first display screen 24, second display screen 26, and bendable display unit 33 may be a single continuous display. In any of the foregoing embodiments, the bendable display unit 33 may also be configured as a touch screen. In such embodiments, the bendable display unit 33 may provide a control mechanism to adjust the bending of the glass article 32.

Figure 2:
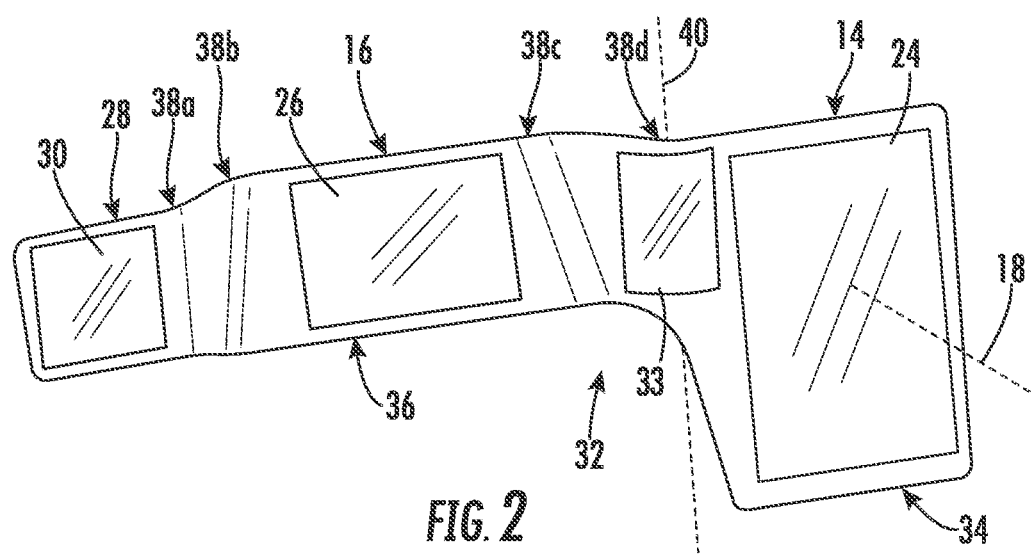
FIG. 2 depicts the glass article of FIG. 1, according to an exemplary embodiment.

FIG. 2 depicts the glass article 32, including the first display screen 24, second display screen 26, the additional display screen 30, and the bendable display unit 33. The first display screen 30 is provided on a first side 34 of the glass article 32, and the second display screen 26 and the additional display screen 30 are provided on a second side 36 of the glass article 32. The bendable display unit 33 is disposed at least partially on each of the first side 34 and the second side 36. As depicted in the embodiment of FIG. 2, the glass article 32 may include one or more curvatures 38a-d. As shown, the combination of curvatures 38a-d place the second display screen 26 behind the first display screen 24 and the additional display screen 30. In this context, "behind" means that the second display screen 26 is in a plane positioned farther from the driver than the planes in which the first display screen 24 and the additional display screen 30 are located. In embodiments, the first display screen 24 and the additional display screen 30 may be located in the same plane, and in other embodiments, the first display screen 24 and the additional display screen 30 may be located in different planed. Further, in embodiments, each plane in which the display screens 24, 26, 30 are located may be parallel to none of the other planes, one of the other planes, or both of the other planes. To achieve the positioning shown in FIG. 2, the glass article 32 includes a first convex curvature 38a and a second concave curvature 38b between the additional display screen 30 and the second display screen 26. Further, the glass article includes a third in concave curvature 38c and a fourth convex curvature 38d between the second display screen 26 and the first display screen 24.

As mentioned, the second side 36 of the glass article 32 is fixed to the dashboard base 12, and the first side 34 of the glass article 32 is bendable about a bending axis 40 relative to the second side 36 of the glass article 32. In embodiments, the fourth convex curvature 38d is formed on the bending axis 40. In this way, the first side 34 is bendable such that the fourth convex curvature 38d is variable and, in particular, can be removed from the glass article 32. That is, the first side 34 of the glass article 32 can be bent so that the glass article 32 is substantially planar between the third concave curvature 38c and the first side 34 of the glass article 32. The bendable display unit 33 is disposed over the bend axis 40 such that the bendable display unit 33 can also be curved or substantially planar.

In embodiments, at least a portion of the second side 36 of the glass article 32 forms an angle of about 180° (i.e., substantially planar) with the first side 34 in the configuration where the first display screen 24 is oriented towards the driver side 20. In embodiments at least a portion of the second side 36 forms an angle of 190° to about 360° with the first side 34 in a configuration in which the first display screen is oriented between the driver side 20 and the passenger side 22. By "about 360°," it is meant that the first side 34 may be able to fold in half with respect to the second side 36. Thus, the bendable display unit 33 also can be substantially planar (e.g., forming an angle of) 180° or be folded in half.

Figure 3:
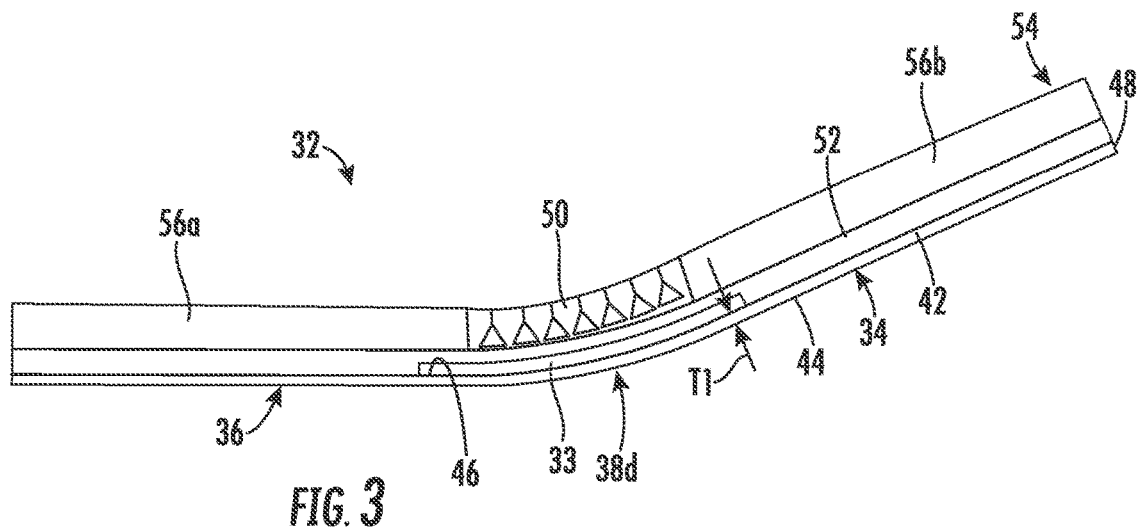
FIG. 3 depicts a side view of a simplified glass article having a living hinge, according to an exemplary embodiment.

FIG. 3 depicts a simplified, schematic side view of the glass article 32 showing the region of the fourth curvature 38d. As can be seen, the glass article 32 includes a glass sheet 42 having a first major surface 44 and a second major surface 46. The second major surface 46 is opposite to the first major surface 44, and a thickness T1 (average thickness or maximum thickness) is defined between the first major surface 44 and the second major surface 46. In embodiments, the thickness is, on average, from 0.3 mm to 2.0 mm, in particular from 0.4 mm to 1.1 mm. A minor surface 48 extends around the perimeter of the glass sheet 42 and connects the first major surface 44 and the second major surface 46.

Disposed on the second major surface 46 is a hinge mechanism 50. In embodiments, the hinge mechanism 50 divides the glass sheet 42 between the first side 34 and the second side 36 and allows for the first side 34 to bend relative to the second side 36 of the glass article 32. In embodiments, the hinge mechanism 50 is positionable such that the first side 34 can be put at any angle between maximum travel positions of the first side 34 (i.e., between the planar configuration oriented toward the driver side and the bent configuration oriented equally between the driver side and the passenger side). Further, in embodiments, the hinge mechanism 50 is manually actuatable, i.e., a user can position the first side 34 of the glass article 32 by hand. In other embodiments, the hinge mechanism 50 is electromechanically actuatable such that the first side 34 is positioned by an actuator activated, e.g., by a touch feature, voice command, or push button, by the user. The hinge mechanism 50 can be any of a variety of hinges suitable to provide a bending axis 40, such as a living hinge, a mandrel hinge, a flexure hinge, a lattice hinge, or a links hinge, among others.

In embodiments, the hinge mechanism 50 is a single hinge. In embodiments, the single hinge 50 extends from 10% up to an entire length of the bending axis 40 between the first side 34 and the second side 36. In other embodiments, at least two hinges 50 are provided along the bending axis 40 between the first side 34 and the second side 36. In such embodiments, the hinges 50 may be equidistantly spaced along the bending axis 40.

An adhesive material 52 is molded or applied onto a least a portion of the second major surface 46 of the glass sheet 42. In embodiments, the adhesive material 52 is selected to encapsulate, support, and/or protect the glass sheet 42. In particular, the adhesive material 52 may be used to protect the glass sheet 42 from edge stresses at a free end 54 of the glass sheet 42. Further, in embodiments, the adhesive material 52 covers not only a portion of the second major surface 46 but also at least a portion of the minor surface 48. In still other embodiments, the adhesive material 52 may cover a portion of the first major surface 44 of the glass sheet 42. In embodiments, the adhesive material 52 also bonds the hinge 50 to the second major surface 46 of the glass sheet 42. In other embodiments, the hinge mechanism 50 is not bonded to the second major surface 46 of the glass sheet 42 but may be held in place by the adhesive material 52.

In embodiments, the adhesive material 52 comprises, e.g., polyurethane, polyvinylchloride, and reaction injection molding materials, among others. As used herein, "reaction injection molding materials" include thermosetting polymers that cure within a mold during an injection molding procedure. In embodiments, reaction injection molding materials include polyurethane, polyureas, polyisocyanurates, polyesters, polyphenols, polyepoxides, and nylon 6. In embodiments, the adhesive material 52 may include reinforcing agents, such as glass fiber or mica.

As can be seen in FIG. 3, the hinge mechanism 50 may be connected to or may incorporate a first frame 56a and a second frame 56b (referred to generally as frame or frames 56). As will be discussed below, the frames 56 may be used to position the free end 54 of the glass article 32 and to attach the glass article 32 to a vehicle interior base. In embodiments, the frames 56 are made of an aluminum alloy, a steel alloy, or an acrylic material. FIG. 3 also depicts the bendable display unit 33 (e.g., OLED display unit, micro-LED display, or flexible LCD) embedded in the adhesive material 52 such that the adhesive material 52 hermetically seals the bendable display unit 33.

Figure 4:
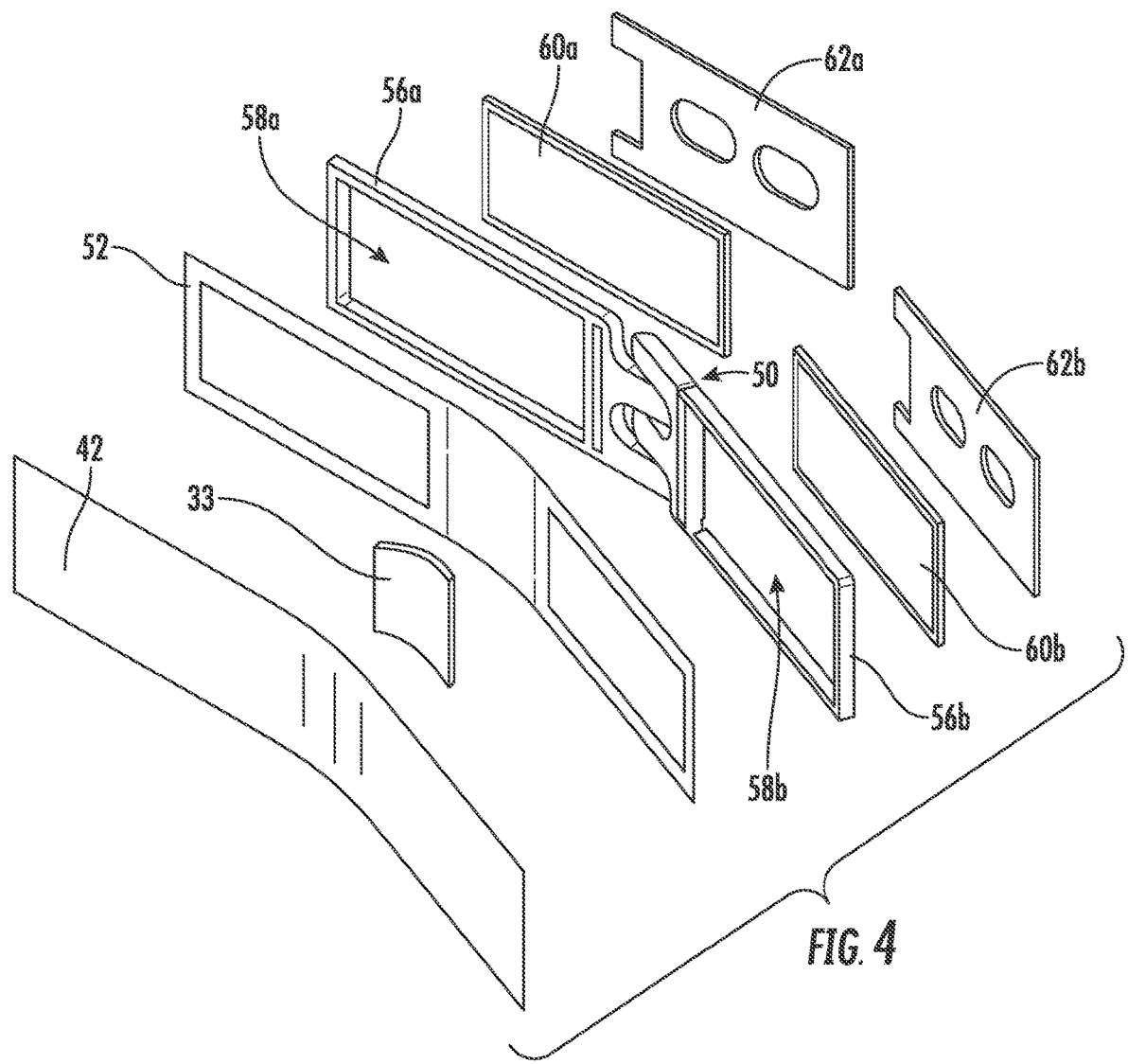
FIG. 4 depicts an exploded, perspective view of a glass article, according to an exemplary embodiment.

FIG. 4 depicts an exploded, perspective view of a glass article 32 according to the present disclosure. As can be seen in FIG. 4, the first frame 56a and second frame 56b each include a respective first aperture 58a and second aperture 58b (generally, aperture or apertures 58) that accommodate a respective first display unit 60a and a second display unit 60b (generally, display unit or display units 60), e.g., the first display screen 24 and the second display screen 26 (as shown in FIGS. 1 and 2). Further, the first display unit 60a and the second display unit 60b may each be mechanically reinforced by a respective first support member 62a and second support member 62b (generally, support member or support members 62). In embodiments, the hinge mechanism 50 is not connected to the frames 56 and is instead connected to the support members 62. In such embodiments (including embodiments depicted below), the glass article 32 may not include the frames 56. Further, in embodiments (e.g., as shown in FIG. 3), the hinge mechanism 50 may be embedded in the adhesive material 52 and not directly connected to either a frame 56 or a support member 62.

Returning to the embodiment depicted in FIG. 4, the adhesive material 52 bonds the frames 56 and hinge mechanism 50 to the glass sheet 42. An optically clear adhesive may be used to bond the display units 60 to the glass sheet 42 within respective apertures 58 of the frames 56. Another layer of adhesive (not shown) may join the support members 62 to the rear surface of the display units 60, and/or the support members 62 may mechanically interlock with the frames 56.

Having described generally the components of the glass article 32, FIGS. 5-13 depict various embodiments in which such components are assembled in a glass article 32.

Figure 5A:
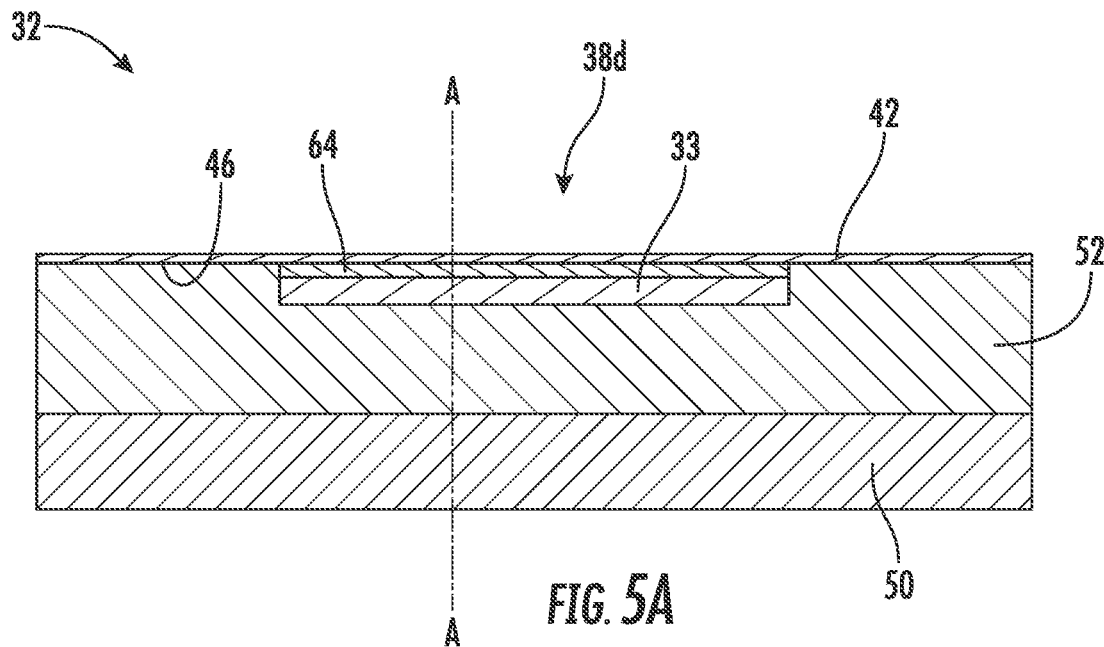

Referring first to FIG. 5A, a cross-section across the width of the fourth curvature 38d of a glass article 32 is depicted. In particular, with reference to the orientation shown in FIG. 5A (as well as FIGS. 6A-13A), the bend axis would be perpendicular to the page relative to what is depicted (or parallel to the plane depicted in each of FIG. 5B-13B). As can be seen in FIG. 5A, this embodiment of the glass article 32 includes the hinge mechanism 50 having adhesive material 52 applied thereon. The adhesive material 52 surrounds the bendable display unit 33 and bonds the second major surface 46 of the glass sheet 42 to the hinge mechanism 50. In embodiments, the bendable display unit 33 includes a front display surface, a peripheral display surface, and a rear display surface. The front display surface of the bendable display unit 33 is bonded to the second major surface 46 of the glass sheet 42 using an optically clear adhesive 64. The adhesive material 52 is bonded to the peripheral display surface and the rear display surface of the bendable display unit 33.

Figure 5B:
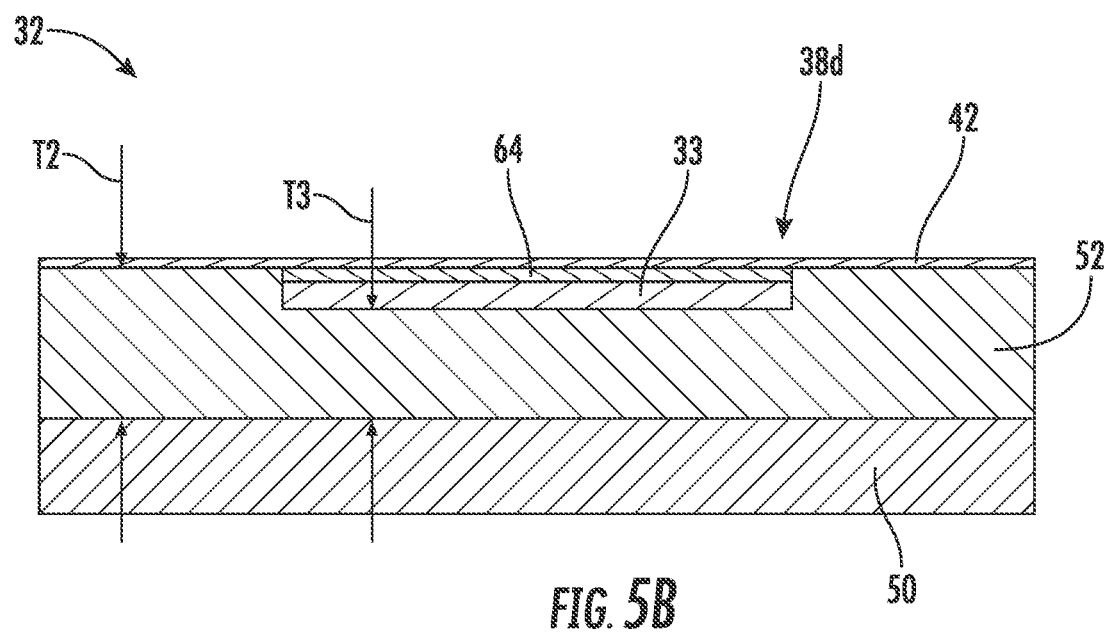

FIG. 5B depicts another cross-section of the fourth curvature 38d of the glass article 32 taken along line A-A of FIG. 5A. As can be seen in FIG. 5B, the adhesive material 52 entirely surrounds the bendable display unit 33 and adheres not only the glass sheet 42 to the hinge mechanism 50 but also the bendable display unit 33 to the hinge mechanism 50. In embodiments, the adhesive material 52 defines a second thickness of, e.g., 5 µm to 10 mm between the glass sheet 42 and hinge mechanism 50, and the adhesive material 52 defines a third thickness of, e.g., 5 µm to 10 mm between the rear display surface of the bendable display unit 33 and hinge mechanism 50. Further, by bonding to the peripheral display surface and rear display surface, the adhesive material 52 provides hermetic sealing of the bendable display unit 33 between the glass sheet 42 and the adhesive material 52.

Figure 6A:
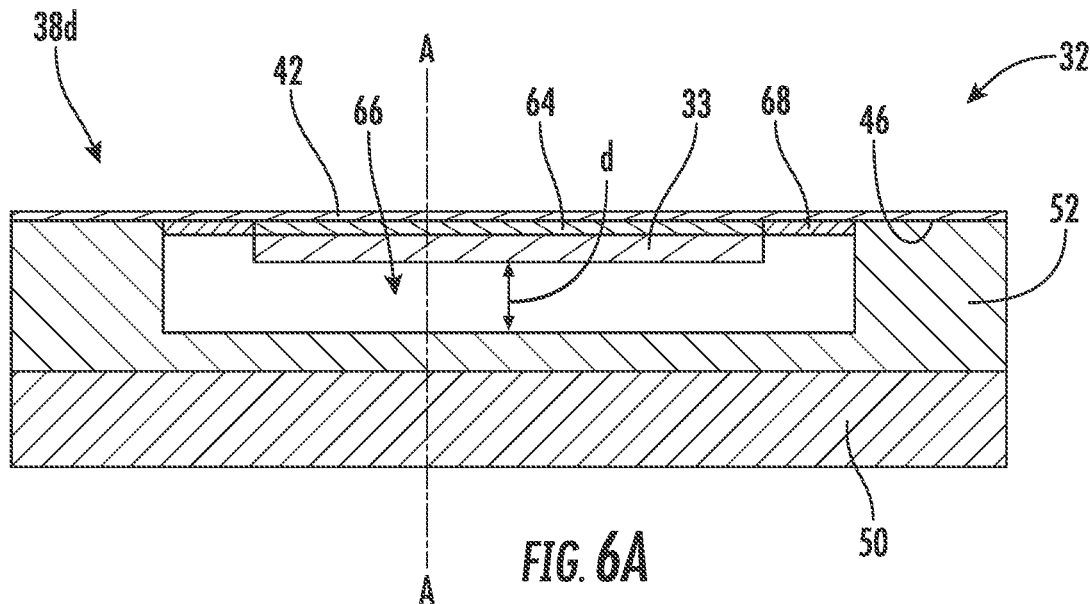

FIG. 6A depicts a cross-section of the fourth curvature 38d of another embodiment of a glass article 32. The glass article 32 is similar to what is depicted in FIG. 5A with the exception that the adhesive material 52 is not bonded to the peripheral surface or rear surface of the bendable display unit 33. The adhesive material 52 still bonds the second major surface 46 of the glass sheet to the hinge mechanism 50 and the adhesive material 52 is disposed between the hinge mechanism 50 and the bendable display unit 33. In FIG. 6A, a gap 66 is shown between the adhesive material 52 and the bendable display unit 33. In embodiments, the gap 66 separates the bendable display unit 33 from the adhesive material 52 by a distance d of, e.g., 1 µm to 10 mm.

Further, in embodiments, the second major surface 46 of the glass sheet 42 includes an anti-splinter film (ASF) 68, e.g., a polyester film material. The ASF 68 provides protection against impact and pressure on the glass sheet 42. As shown in FIG. 6A, the ASF 68 surrounds the bendable display unit 33, and in embodiments, the ASF 68 may also be disposed between the bendable display unit 33 and the glass sheet 42. In embodiments, the ASF 68 provides a border around the display unit 33 that prevents contact and minimizes transfer of mechanical stresses between the bendable display unit 33 and the surrounding hinge mechanism 50 and/or frame 56 (e.g., that might otherwise result from differential thermal expansion of the materials of the glass sheet 42, the hinge mechanism 50, and/or frame 56). In embodiments, the border thickness of the ASF 68 is from 1 µm to 10 mm.

Figure 6B:
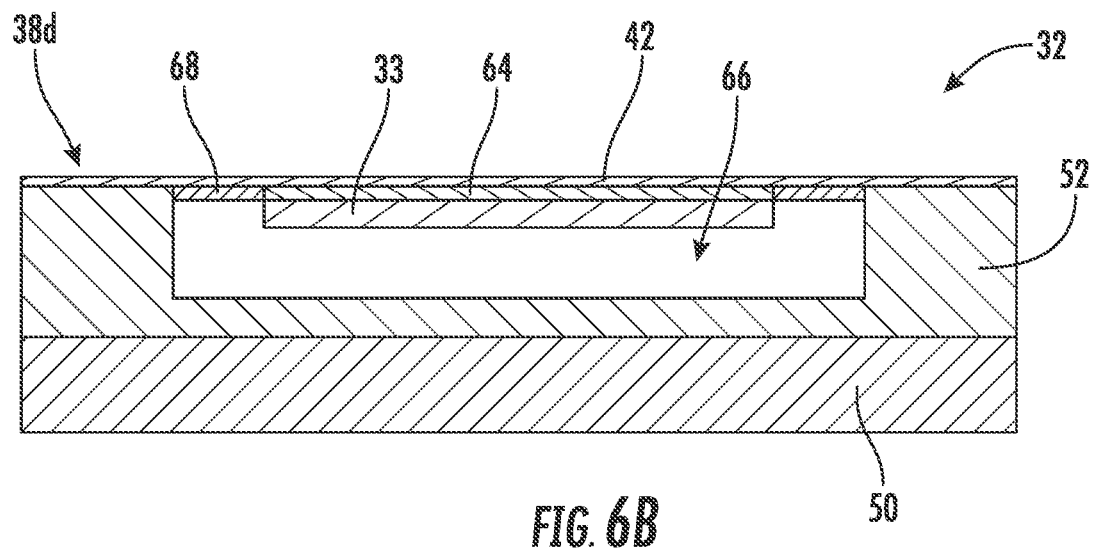

FIG. 6B depicts another cross-section of the fourth curvature 38d of the glass article 32 taken along line A-A of FIG. 6A. As can be seen in FIG. 6B, the adhesive material 52 entirely surrounds the bendable display unit 33. Further, as can be seen in FIG. 6B, the gap 66 also extends across the entire bendable display unit 33. Still further, in embodiments, the ASF 68 extends around the entirety of the bendable display unit 33. In the embodiments according to FIGS. 6A and 6B, the adhesive material 52 still provides hermetic sealing of the bendable display unit 33, but because the bendable display unit 33 is not bonded to the hinge mechanism 50, transfer of mechanical forces from the hinge mechanism 50 to the bendable display unit 33 is diminished. In this way, the hinge mechanism 50 does not interfere with the bendable display unit 33 and vibrations from the hinge mechanism 50 are diminished. Additionally, thermally induced shear stresses between the bendable display unit 33 and the hinge mechanism 50 are de-coupled, which can help prevent delamination of the bendable display unit 33 from the glass sheet 42. Further, user touch force response can be tuned for the bendable display unit 33 when the gap 66 is provided. Notwithstanding the lack of bond between the bendable display unit 33 and the hinge mechanism 50, headform impact testing (HIT) performance, discussed in more detail below, is not detrimentally affected.

Figure 7A:
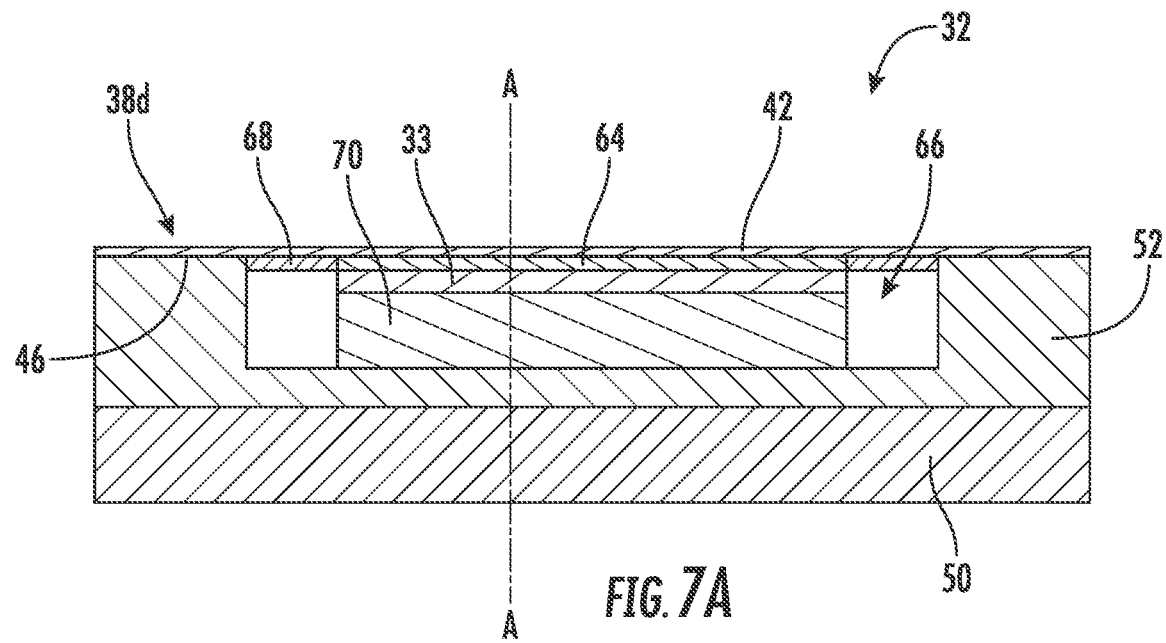

FIG. 7A depicts a cross-section of the fourth curvature 38d of another embodiment of a glass article 32. The embodiment of FIG. 7A is substantially similar to the embodiment of FIG. 6A with the exception that, in FIG. 7A, a spacer 70 is provided in the gap 66 between the adhesive material 52 and the bendable display unit 33. The spacer 70 is compliant by virtue of its construction and/or material from which it is made. In embodiments, the spacer 70 comprises a honeycomb structure material, a rubber gasket, or an air bladder, among others. In embodiments, the spacer 70 is not bonded to either the display unit 60 or the adhesive material 52 but is in contact with both. In other embodiments, the spacer 70 is bonded to only one of the bendable display unit 33 or the adhesive material 52. In embodiments, the spacer 70 fills the gap 66 between the bendable display unit 33 and the adhesive material 52. Further, as shown in FIG. 7A, the spacer 70 is co-extensive with the rear surface of the bendable display unit 33, but in other embodiments, the spacer 70 could have a larger area than the bendable display unit 33 or even a slightly smaller area than the bendable display unit 33. In embodiments in which the spacer 70 is coextensive with or smaller than the area of the bendable display unit 33, the space around the bendable display unit 33 provides a non-contact region, reducing stress and creating a thermal barrier. Further, the space may provide room for housing other components (e.g., wires or other electronics associated with the display or touch functionality, including buttons). As with the previous embodiment, an ASF 68 may be provided on the second major surface 46 of the glass sheet 42 to help prevent damage from impact or pressure on the glass sheet 42.

Figure 7B:
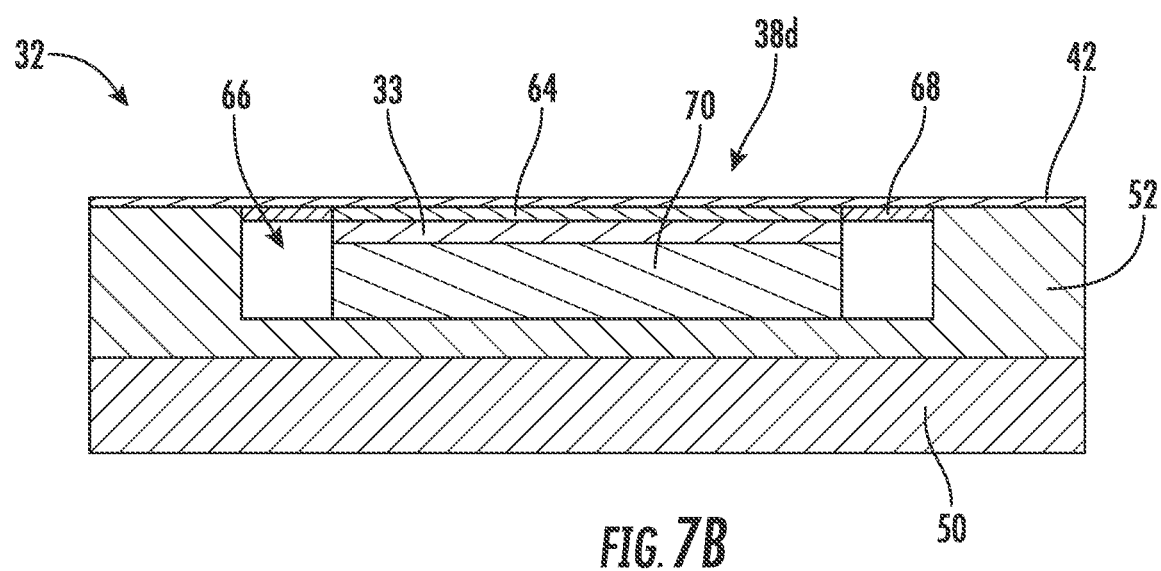

FIG. 7B depicts another cross-section of the fourth curvature 38d of the glass article 32 taken along line A-A of FIG. 7A. Like the previous embodiment, the adhesive material 52 still provides hermetic sealing of the display unit 60, but because the bendable display unit 33 is not bonded to the hinge mechanism 50, transfer of mechanical forces from the hinge mechanism 50 to the bendable display unit 33 is diminished. In this way, the hinge mechanism 50 does not interfere with the bendable display unit 33 and vibrations from the hinge mechanism 50 are diminished. Additionally, thermally induced shear stresses between the bendable display unit 33 and the hinge mechanism 50 are de-coupled, which can help prevent delamination of the bendable display unit 33 from the glass sheet 42. Further, user touch force response can be tuned for the bendable display unit 33. Moreover, the use of the spacer 70 between the bendable display unit 33 and the hinge mechanism 50 enhances headform impact testing performance. Still further, using a spacer having, e.g., a honeycomb aluminum structure can provide a heatsink for the bendable display unit 33 to improve conduction of heat away from the bendable display unit 33.

Figure 8A:
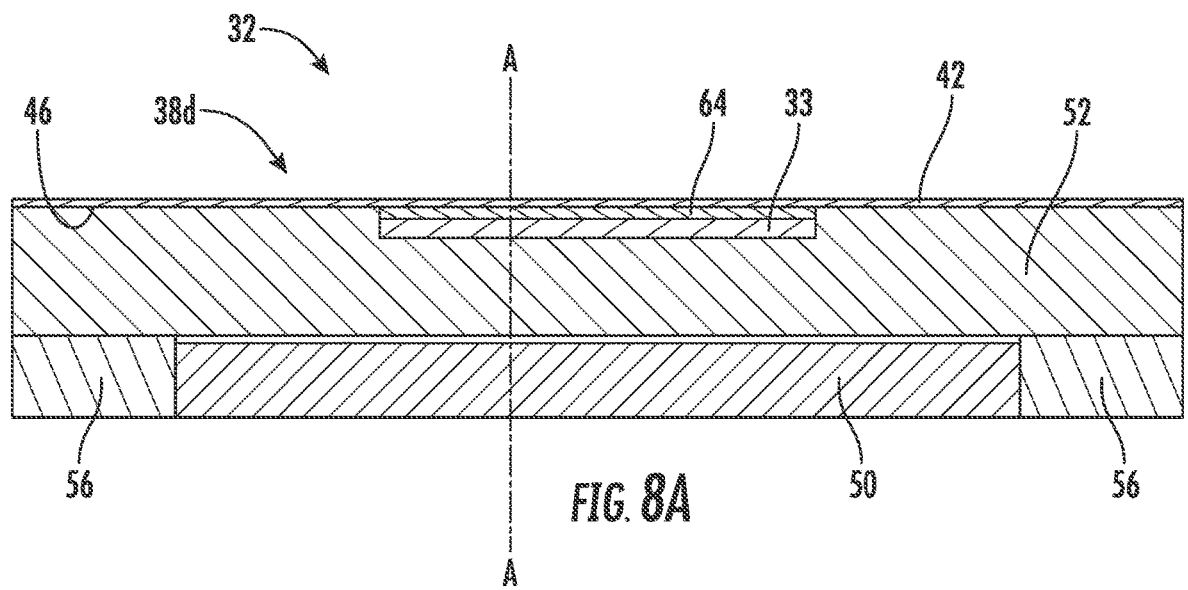

FIG. 8A depicts a cross-section of the fourth curvature 38d of another embodiment of a glass article 32. The embodiment of FIG. 8A is substantially similar to the embodiment of FIG. 5A with the exception that, in FIG. 8A, the glass article 32 includes a frame 56 along with the hinge mechanism 50 (e.g., as shown in FIGS. 3 and 4). The bendable display unit 33 is positioned between the hinge mechanism 50 and the glass sheet 42. The adhesive material 52 bonds the glass sheet 42 to the frame 56 outside of the region of the bendable display unit 33, and in the region of the bendable display unit 33, the adhesive material 52 does not bond the bendable display unit 33 to the hinge mechanism 50 at least in the region below the bendable display unit 33. Thus, as shown in FIG. 8A, a gap is shown between the hinge mechanism 50 and the adhesive material 52 (although, in practice, the adhesive material 52 may actually be in contact with but not bonded to the hinge mechanism 50). In particular, in FIG. 8A, the adhesive material 52 is not bonded to the hinge mechanism 50 at all across the width of the fourth curvature 38d. However, in FIG. 8B, the adhesive material 52 is bonded to the hinge mechanism along the length in the regions outside the bendable display unit 33; although, in other embodiments, the hinge mechanism 50 may not be bonded to the adhesive material 52 at all along both the length and width of the fourth curvature 38d.

As with previously described embodiments, the de-coupling of the adhesive material 52 and hinge mechanism 50 reduces the transfer of thermal and mechanical stresses from the hinge mechanism 50 to the bendable display unit 33. Nevertheless, the adhesive material 52 is bonded to the peripheral and rear surfaces of the bendable display unit 33 so as to still provide hermetic sealing for reliable operation of the bendable display unit 33.

Figure 8B:
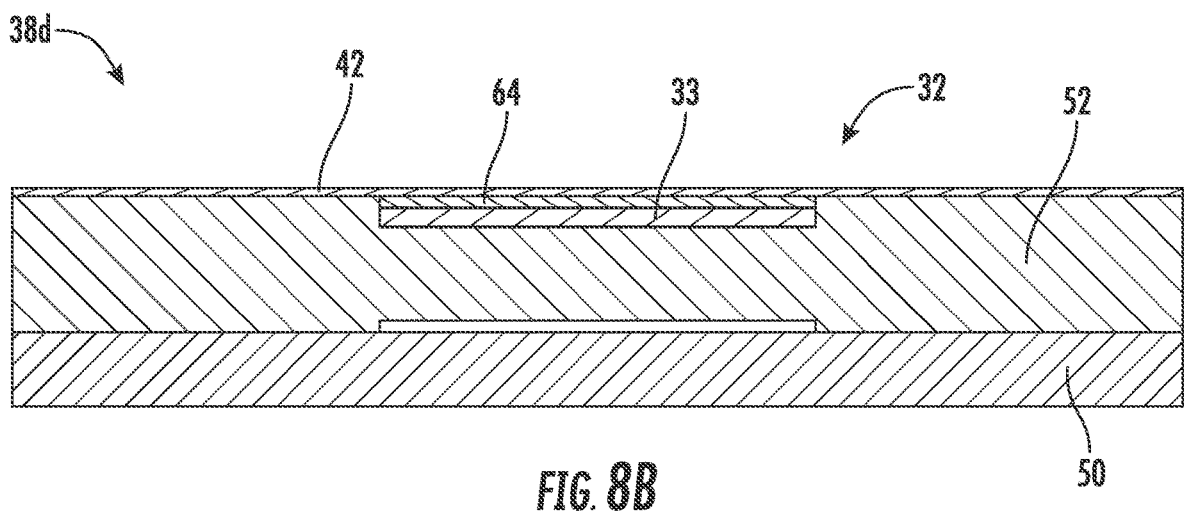
Figure 9A:
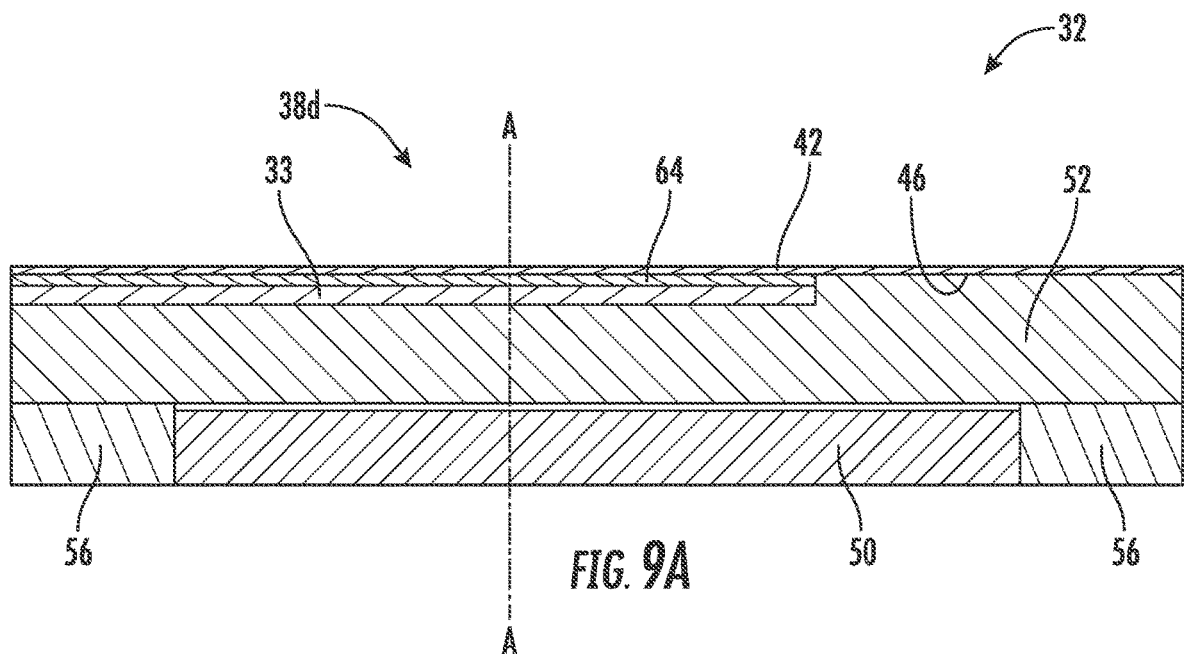
Figure 9B:
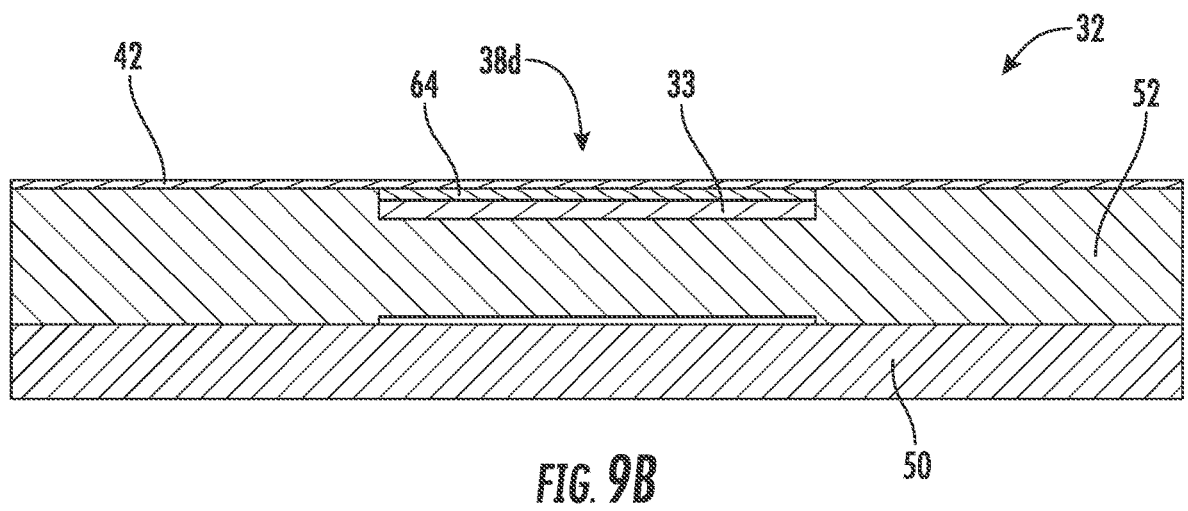

FIGS. 9A and 9B depict an embodiment substantially similar to the previous embodiment shown in FIGS. 8A and 8B. The primary difference between the previous embodiment and the embodiment of FIGS. 9A and 9B is that the bendable display unit 33 extends past the frame 56 on one side of hinge mechanism 50. However, in other embodiments, the bendable display unit 33 extends past both frames 56 on either side of the hinge mechanism 50. For example, as discussed above, the bendable display unit 33, first display screen 24, and second display screen 26 may be one continuous display unit extending across the bend axis from the first side 34 to the second side 36.

FIG. 10A depicts a cross-section of the fourth curvature 38d of another embodiment of a glass article 32. In the embodiment of FIG. 10A, the bendable display unit 33 is not bonded to the adhesive material 52; however, the adhesive material is bonded to both the hinge mechanism 50 and the frames 56. While a gap is depicted between the bendable display unit 33 and the adhesive material 52, in other embodiments, the bendable display unit 33 may be in contact (but not bonded) with the adhesive material 52. By not bonding the bendable display unit 33, the bendable display unit 33 is closer to a neutral stress plane when bending the glass article 32, minimizing shear stresses on the bendable display unit 33. Further, a spacer 70 is provided around the bendable display unit 33. In particular, the spacer 70 may provide a border around the bendable display unit 33 to prevent contact between the bendable display unit 33 and the hinge mechanism 50 and/orframe 56. Further, because the spacer 70 is not bonded to the bendable display unit 33, shear stresses cannot be transferred from the spacer 70 to the bendable display unit 33. The spacer 70 can the same as the spacer 70 described above in relation to FIGS. 7A and 7B. Further, like the previous embodiment, the bendable display unit 33 extends past the frame 56 on at least one side of the hinge mechanism 50.

FIG. 10B depicts another cross-section of the glass article 32 taken along line A-A of FIG. 10A. As can be seen in FIG. 10B, the adhesive material 52 surrounds the bendable display unit 33. Thus, as with the previous embodiments, the adhesive material 52 provides hermetic sealing of the bendable display unit 33. Further, because the adhesive material 52 does not couple the bendable display unit 33 to the hinge mechanism 50, mechanical and thermal stresses are not transferred from the hinge mechanism 50 to the bendable display unit 33.

Figure 11A:
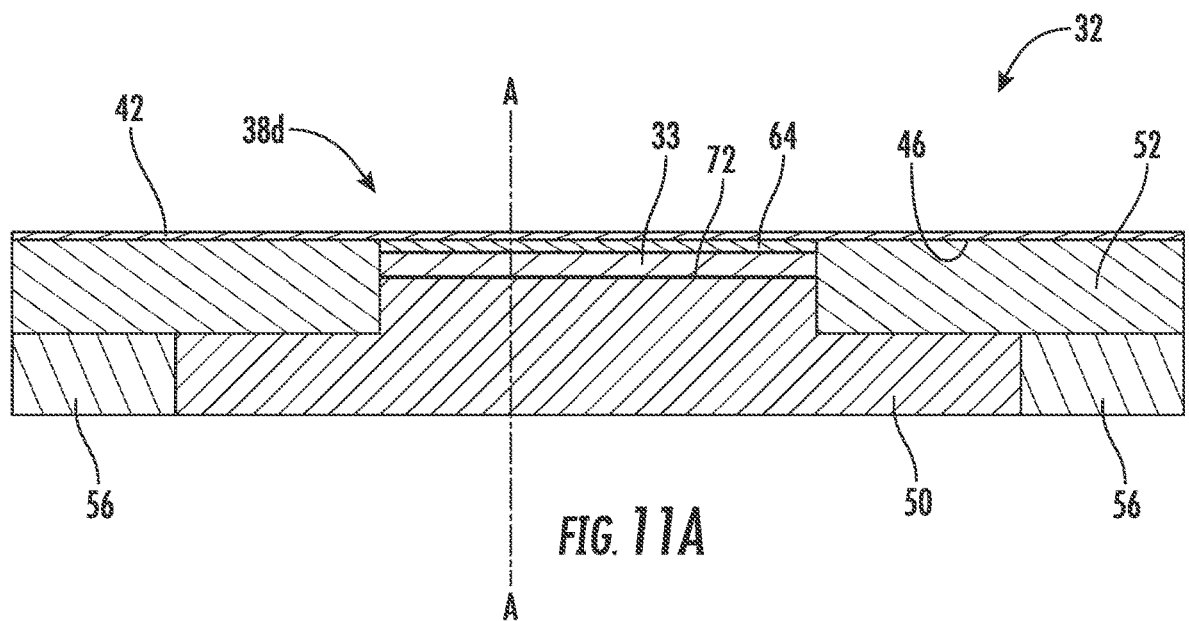
Figure 11B:
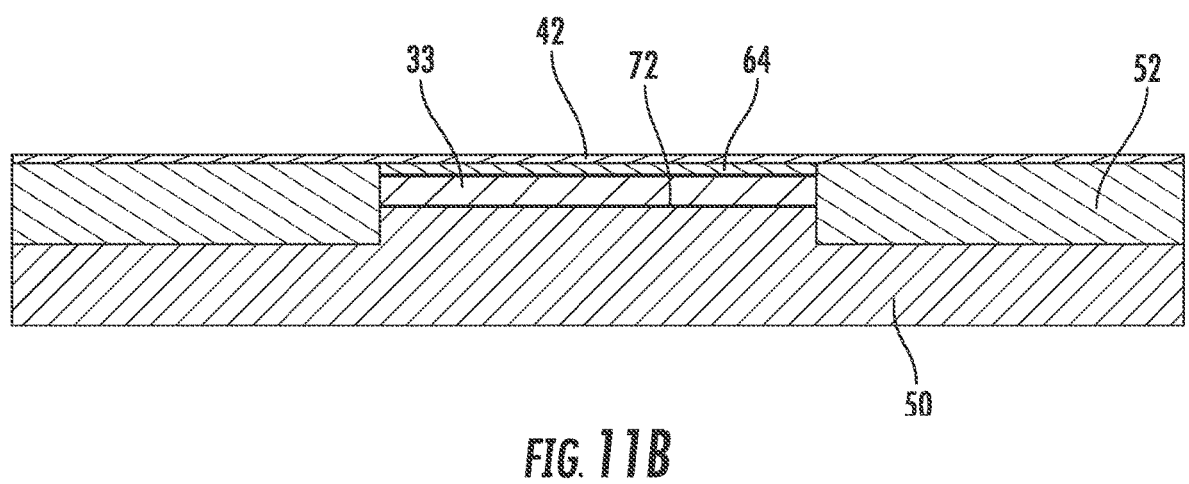

FIGS. 11A and 11B depict a cross-section of the fourth curvature 38d of another embodiment of a glass article 32. In the embodiment of FIGS. 11A and 11B, the hinge mechanism 50 includes a protrusion 72 that extends into contact with the bendable display unit 33. As can be seen in FIGS. 11A and 11B, the bendable display unit 33 is not bonded to the protrusion 72. Instead, the bendable display unit 33 is bonded to the second major surface 46 of the glass sheet 42, and the second major surface 46 of the glass sheet 42 is bonded to the hinge mechanism 50 and to the frames 56 via the adhesive material 52. In the embodiment of FIGS. 11A and 11B, the protrusion 72 provides heat conduction away from the bendable display unit 33. However, because the bendable display unit 33 is not bonded to the protrusion 72, at least some of the mechanical and thermal stresses from the hinge mechanism 50 are not transferred to the bendable display unit 33. Further, in this embodiment, the hermetic seal is created between the glass sheet 42, adhesive material 52, and the hinge mechanism 50.

Figure 12A:
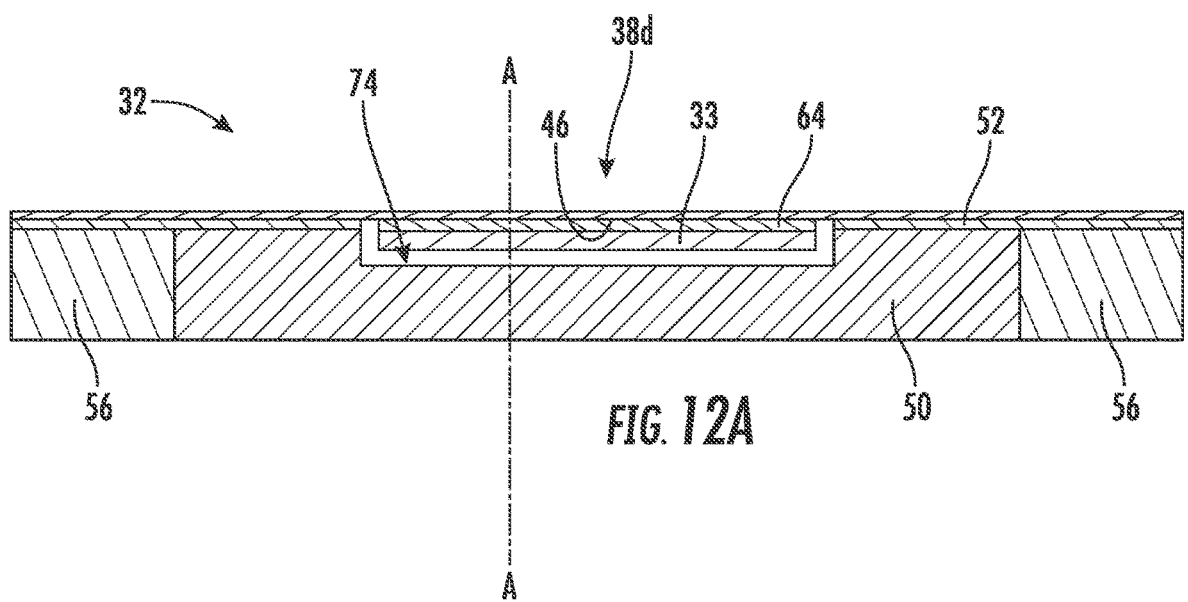
Figure 12B:
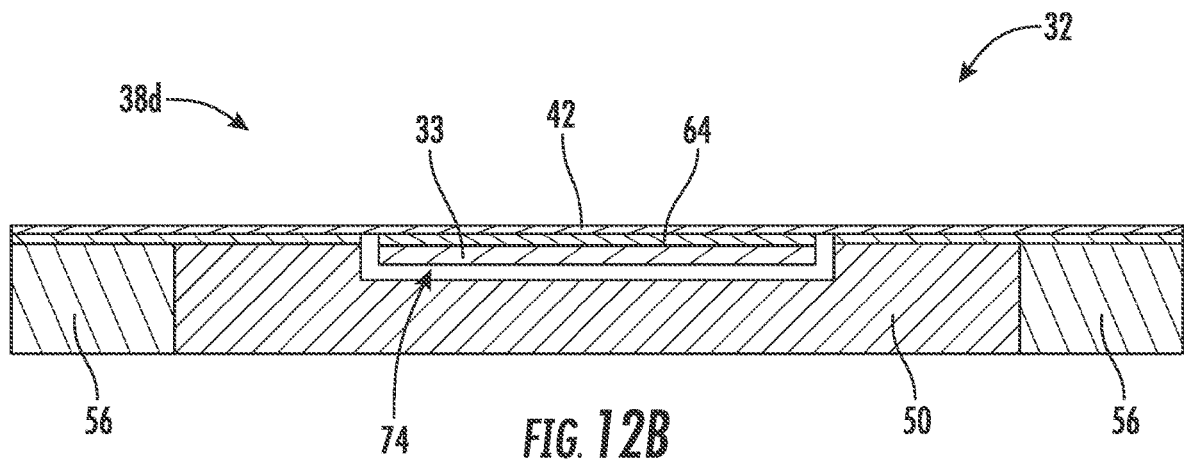

FIGS. 12A and 12B depict a cross-section of the fourth curvature 38d of another embodiment of a glass article 32. In the embodiment of FIGS. 12A and 12B, the hinge mechanism 50 includes a recess 74 into which the bendable display unit 33 extends. As can be seen in FIGS. 12A and 12B, the bendable display unit 33 is not bonded to the recess 74. Instead, the bendable display unit 33 is bonded to the second major surface 46 of the glass sheet 42, and the second major surface 46 of the glass sheet 42 is bonded to the hinge mechanism 50 and to the frames 56 via the adhesive material 52 (having a thickness, e.g., of 1 µm to 10 mm). In such embodiments, a gap may be provided between the rear surface of the bendable display unit 33 and the floor of the recess 74 and/or between the peripheral surface of the bendable display unit 33 and the sidewalls of the recess 74. In the embodiment of FIGS. 12A and 12B, the recess 74 provides heat conduction away from the bendable display unit 33. In such embodiments, the recess 74 may be filled with a thermal conduction paste. In other such embodiments, no gap is provided between the peripheral and/or rear surfaces of the bendable display unit 33 and the sidewalls and/or floor of the recess 74 such that the bendable display unit 33 is in contact with the floor and/or sidewall of the recess 74. However, because the bendable display unit 33 is not bonded to the recess 74, at least some of the mechanical and thermal stresses from the hinge mechanism 50 are not transferred to the bendable display unit 33.

Figure 13A:
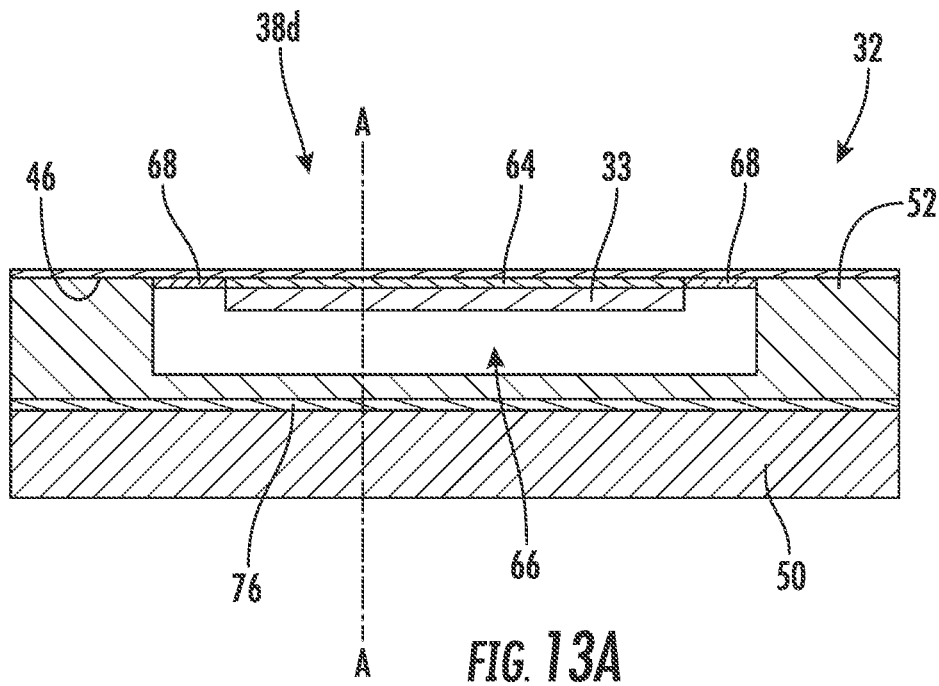

FIG. 13A depicts a cross-section of the fourth curvature 38d of another embodiment of a glass article 32. Similar to the embodiment of FIGS. 6A and 6B, the glass article 32 of FIG. 13A includes a gap 66 between the bendable display unit 33 and the adhesive material 52. Like with that embodiment, the bendable display unit 33 is bonded to the second major surface 46 of the glass sheet 42 via an optically clear adhesive 64. The bendable display unit 33 may also be surrounded with an ASF 68. The adhesive material 52 bonds to the second major surface 46 of the glass sheet 42 outside of the region where the bendable display unit 33 is located. Further, the adhesive material 52 bonds to a backing plate 76, and the hinge mechanism 50 is connected to the backing plate 76. In embodiments, the backing plate 76 may be a thin and bendable sheet of material (e.g., a metal, such as aluminum or a steel alloy, in particular stainless steel). In other embodiments, the backing plate 76 may be segmented for bending. In embodiments, the backing plate 76 has a thickness of 2 mm or less (e.g., 10 µm to 1 mm). In embodiments, the backing plate 76 is configured to survive cyclic bending up to 500,000 cycles.

Figure 13B:
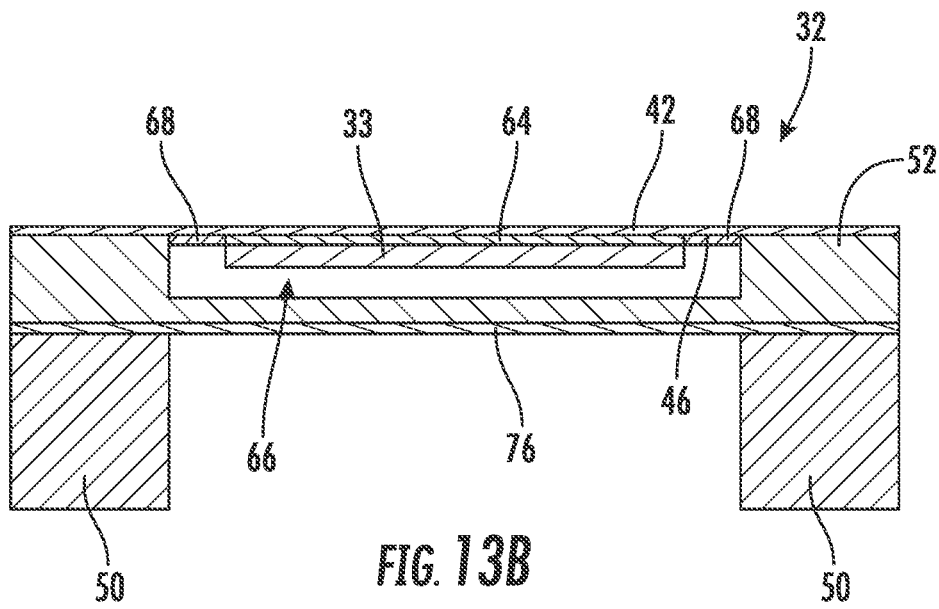

As can be seen in the cross-section of FIG. 13B (taken along line A-A of FIG. 13A), the hinge mechanism 50 is less substantial than in previous embodiments, extending only across a top and bottom of the glass article 32 and providing reduced weight and potentially a less expensive construction. In embodiments, the backing plate 76 includes sealed ports to allow accessibility of the bendable display unit 33 for, e.g., connection to the bendable display unit 33 and/or cable management.

Having described various embodiments of the glass article 32, a method of forming the glass article 32 is now described. In embodiments, the adhesive material 52 is molded onto the glass sheet 42 by an injection molding process. For example, the glass article 32 is formed by arranging the glass sheet 42 in a mold (e.g., a clam shell mold) and positioning the hinge mechanism 50, including any frames 56, support members 62, and/or backing plates 76 within the mold. Additionally, the mold may be shaped to create a void where the bendable display unit 33 is to be positioned, or a removable molding block may be arranged to create a void where the bendable display unit 33 is to be positioned. Thereafter, the adhesive material 52 is injected into the mold so as to cover the second major surface 46 and minor surface 48 as desired. Additionally, the adhesive material 52 bonds to the glass sheet 42, hinge mechanism 50, backing plate 76, frames 56, and/or support members 62 without the need for additional adhesives. Thus, the adhesive material 52 also joins the glass sheet 42, the hinge mechanism 50, backing plate 76, frames 56, and/or the support members 62 into an integral glass article 32. In embodiments, a primer may be applied to one or more of the foregoing components in order to facilitate bonding with the encapsulating material 52.

The curvatures 38a-c of the glass article 32, particularly on the second side 36, can be produced by either hot-forming or cold-forming. By "cold-forming," it is meant that the curvatures 38 are introduced to the glass sheet 42 at a temperature below the softening temperature of the glass. More particularly, cold-forming takes place at below 200° C., below 100° C., or even at room temperature. "Hot-forming" by contrast, takes place at temperatures at or above the softening temperature of the glass sheet 42, using presses, sagging apparatuses, forming lehrs, etc. A further distinguishing feature between hot-forming and cold-forming is that the curvatures 38 introduced by hot-forming are permanent in that the glass sheet 42 will retain the curvatures until re-formed at a temperature at or above the softening temperature.

Curvatures introduced by cold-forming are not permanent. In particular, during cold forming, pressure is applied to the glass sheet 42 to bring the glass sheet 42 into conformity with a desired shape. Pressure may be applied in a variety of different ways, such as vacuum pressure, a mechanical press, rollers, etc. The glass sheet 42 is then bonded to a support structure (e.g., frames 56) to retain the glass sheet 42 in its cold-formed shape. However, if debonded from the support structure, the glass sheet 42 will spring back to its planar configuration. This property is exploited for the fourth curvature 38d shown in FIG. 2, and by using the hinge mechanism 50, the glass sheet 42 is allowed to bend between the planar configuration (oriented towards the driver side 20) and the bent configuration (oriented between the driver side 20 and the passenger side 22). However, the other curvatures 38a-c, being on the fixed, second side 36, would be retained in their cold-formed position.

In embodiments, the glass sheet 42 is hot-formed to introduce desired curvatures 38a-c prior to injection molding or application of the adhesive material 52. In other embodiments, the glass sheet 42 is cold-formed prior to injection molding or application of the adhesive material 52 to introduce desired curvatures 38. In still other embodiments, the glass sheet 42 is cold-formed during injection molding or application of the adhesive material 52 to introduce desired curvatures 38.

Advantageously, the glass articles 32 described herein are configured to pass head impact testing (HIT) requirements. During HIT, interior surfaces of a vehicle are investigated to determine whether vehicle interior systems meet relevant head injury criterion (HIC) based on simulated head impact with the vehicle interior system during a crash. In particular, a headform simulating a human head is used to determine the deceleration characteristics of an impact with the tested vehicle interior system. Successful test performance is achieved by reducing both the magnitude of deceleration and the time over which it occurs. As defined in US DOT FMVSS 201, the headform should not exceed 80 g for more than 3 ms when the headform impacts at a speed of 15 mph. Additionally, it is desired that the glass sheet 42 remain intact after HIT so that sharp glass fragments are not produced, which may also contribute to injury.

HIT performance of the disclosed glass article 32 can be manipulated through the constructions described above. Specifically, the hinge mechanism 50, frame 56, support members 62, bonded or un-bonded regions of adhesive material 52, gap 66, spacer 70, and/or backing plate 76 can be tailored to provide a degree of stiffness and flexural rigidity that is not so high as to create too large of a magnitude of deceleration and not so low as to create a large deflection of the glass sheet, contributing to fracture of the glass sheet 42. These considerations are relevant to any glass surface in a vehicle interior, and the presently disclosed glass article 32 presents the additional issue of accounting for the dynamic motion of the glass article 32 based on the ability of the first side 34 to bend relative to the second side 36. Notwithstanding, the glass article 32 can be configured to provide the stiffness and flexural rigidity necessary to pass HIT through the constructions disclosed herein.

In the following paragraphs and with reference to FIGS. 1-3, various geometrical properties of the glass sheet 42 as well as compositions of the glass sheet are provided. As mentioned above, the glass sheet 42 has a thickness T1 that is substantially constant and is defined as a distance between the first major surface 44 and the second major surface 46. In various embodiments, T1 is from 0.3 mm to 2.0 mm. In addition, the glass sheet 42 includes a width W defined as a first maximum dimension of one of the first or second major surfaces 44, 46 orthogonal to the thickness T1, and a length L defined as a second maximum dimension of one of the first or second major surfaces 44, 46 orthogonal to both the thickness T1 and the width. In other embodiments, width W and length L may be the average width and the average length of the glass sheet 42, respectively, and in other embodiments, width W and length L may be the maximum width and the maximum length of the glass sheet 42, respectively (e.g., for glass sheets 42 having a variable width or length). In various embodiments, width W is in a range from 5 cm to 250 cm, and length L is in a range from about 5 cm to about 1500 cm. Further, in various embodiments, the curvatures 38a-d of the glass article 32 may have each have a radius of curvature in a range from about 20 mm to about 10,000 mm.

Further, the various embodiments of the vehicle interior system may be incorporated into vehicles such as trains, automobiles (e.g., cars, trucks, buses and the like), sea craft (boats, ships, submarines, and the like), and aircraft (e.g., drones, airplanes, jets, helicopters and the like).

In embodiments, the glass sheet 42 may be strengthened. In one or more embodiments, glass sheet 42 may be strengthened to include compressive stress that extends from a surface to a depth of compression (DOC). The compressive stress regions are balanced by a central portion exhibiting a tensile stress. At the DOC, the stress crosses from a positive (compressive) stress to a negative (tensile) stress.

In various embodiments, glass sheet 42 may be strengthened mechanically by utilizing a mismatch of the coefficient of thermal expansion between portions of the article to create a compressive stress region and a central region exhibiting a tensile stress. In some embodiments, the glass sheet may be strengthened thermally by heating the glass to a temperature above the glass transition point and then rapidly quenching.

In various embodiments, glass sheet 42 may be chemically strengthened by ion exchange. In the ion exchange process, ions at or near the surface of the glass sheet are replaced by—or exchanged with—larger ions having the same valence or oxidation state. In those embodiments in which the glass sheet comprises an alkali aluminosilicate glass, ions in the surface layer of the article and the larger ions are monovalent alkali metal cations, such as $Li^+$, $Na^+$, $K^+$, $Rb^+$, and $Cs^+$. Alternatively, monovalent cations in the surface layer may be replaced with monovalent cations other than alkali metal cations, such as $Ag^+$ or the like. In such embodiments, the monovalent ions (or cations) exchanged into the glass sheet generate a stress.

Ion exchange processes are typically carried out by immersing a glass sheet in a molten salt bath (or two or more molten salt baths) containing the larger ions to be exchanged with the smaller ions in the glass sheet. It should be noted that aqueous salt baths may also be utilized. In addition, the composition of the bath(s) may include more than one type of larger ions (e.g., Na+ and K+) or a single larger ion. It will be appreciated by those skilled in the art that parameters for the ion exchange process, including, but not limited to, bath composition and temperature, immersion time, the number of immersions of the glass sheet in a salt bath (or baths), use of multiple salt baths, additional steps such as annealing, washing, and the like, are generally determined by the composition of the glass sheet (including the structure of the article and any crystalline phases present) and the desired DOC and CS of the glass sheet that results from strengthening. Exemplary molten bath compositions may include nitrates, sulfates, and chlorides of the larger alkali metal ion. Typical nitrates include $KNO_3$, $NaNO_3$, $LiNO_3$, $NaSO_4$ and combinations thereof. The temperature of the molten salt bath typically is in a range from about 380° C. up to about 450° C., while immersion times range from about 15 minutes up to about 100 hours depending on glass sheet thickness, bath temperature and glass (or monovalent ion) diffusivity. However, temperatures and immersion times different from those described above may also be used.

In one or more embodiments, the glass sheets may be immersed in a molten salt bath of 100% $NaNO_3$, 100% $KNO_3$, or a combination of $NaNO_3$ and $KNO_3$ having a temperature from about 370° C. to about 480° C. In some embodiments, the glass sheet may be immersed in a molten mixed salt bath including from about 5% to about 90% $KNO_3$ and from about 10% to about 95% $NaNO_3$. In one or more embodiments, the glass sheet may be immersed in a second bath, after immersion in a first bath. The first and second baths may have different compositions and/or temperatures from one another. The immersion times in the first and second baths may vary. For example, immersion in the first bath may be longer than the immersion in the second bath.

In one or more embodiments, the glass sheet may be immersed in a molten, mixed salt bath including $NaNO_3$ and $KNO_3$ (e.g., 49%/51%, 50%/50%, 51%/49%) having a temperature less than about 420° C. (e.g., about 400° C. or about 380° C.) for less than about 5 hours, or even about 4 hours or less.

Ion exchange conditions can be tailored to provide a "spike" or to increase the slope of the stress profile at or near the surface of the resulting glass sheet. The spike may result in a greater surface CS value. This spike can be achieved by a single bath or multiple baths, with the bath(s) having a single composition or mixed composition, due to the unique properties of the glass compositions used in the glass sheets described herein.

In one or more embodiments, where more than one monovalent ion is exchanged into the glass sheet, the different monovalent ions may exchange to different depths within the glass sheet (and generate different magnitudes stresses within the glass sheet at different depths). The resulting relative depths of the stress-generatingions can be determined and cause different characteristics of the stress profile.

CS is measured using those means known in the art, such as by surface stress meter (FSM) using commercially available instruments such as the FSM-6000, manufactured by Orihara Industrial Co., Ltd. (Japan). Surface stress measurements rely upon the accurate measurement of the stress optical coefficient (SOC), which is related to the birefringence of the glass. SOC in turn is measured by those methods that are known in the art, such as fiber and four point bend methods, both of which are described in ASTM standard C770-98 (2013), entitled "Standard Test Method for Measurement of Glass Stress-Optical Coefficient," the contents of which are incorporated herein by reference in their entirety, and a bulk cylinder method. As used herein CS may be the "maximum compressive stress" which is the highest compressive stress value measured within the compressive stress layer. In some embodiments, the maximum compressive stress is located at the surface of the glass sheet. In other embodiments, the maximum compressive stress may occur at a depth below the surface, giving the compressive profile the appearance of a "buried peak."

DOC may be measured by FSM or by a scattered light polariscope (SCALP) (such as the SCALP-04 scattered light polariscope available from GlasStress Ltd., located in Tallinn Estonia), depending on the strengthening method and conditions. When the glass sheet is chemically strengthened by an ion exchange treatment, FSM or SCALP may be used depending on which ion is exchanged into the glass sheet. Where the stress in the glass sheet is generated by exchanging potassium ions into the glass sheet, FSM is used to measure DOC. Where the stress is generated by exchanging sodium ions into the glass sheet, SCALP is used to measure DOC. Where the stress in the glass sheet is generated by exchanging both potassium and sodium ions into the glass, the DOC is measured by SCALP, since it is believed the exchange depth of sodium indicates the DOC and the exchange depth of potassium ions indicates a change in the magnitude of the compressive stress (but not the change in stress from compressive to tensile); the exchange depth of potassium ions in such glass sheets is measured by FSM. Central tension or CT is the maximum tensile stress and is measured by SCALP.

In one or more embodiments, the glass sheet may be strengthened to exhibit a DOC that is described as a fraction of the thickness T of the glass sheet 42 (as described herein). For example, in one or more embodiments, the DOC may be equal to or greater than about 0.05 T to about 0.25 T. In some instances, the DOC may be about 20 µm to about 300 µm. Further, in one or more embodiments, the strengthened glass sheet may have a CS (which may be found at the surface or a depth within the glass sheet) of about 200 MPa or greater, about 500 MPa or greater, or about 1000 MPa or greater. In one or more embodiments, the strengthened glass sheet may have a maximum tensile stress or central tension (CT) of about 20 MPa or greater, about 50 MPa or greater, or about 85 MPa or greater.

Suitable glass compositions for use in glass sheet 42 include soda lime glass, aluminosilicate glass, borosilicate glass, boroaluminosilicate glass, alkali-containing aluminosilicate glass, alkali-containing borosilicate glass, and alkali-containing boroaluminosilicate glass.

In one or more embodiments, the glass composition may include $SiO_2$ in an amount in a range from about 66 mol % to about 80 mol %, $Al_2O_3$ in an amount in a range from about 4 mol % to about 15 mol %, $B_2O_3$ in an amount in a range from about 0 mol % to about 5 mol %, $P_2O_5$ in an amount in a range from about 0 mol % to about 2 mol %, $R_2O$ in an amount in a range from about 8 mol % to about 20 mol %, RO in an amount in a range of from about 0 mol % to about 2 mol %, $ZrO_2$ in an amount in a range of from about 0 mol % to about 0.2 mol %, and $SnO_2$ in an amount in a range from about 0 mol % to about 0.2 mol %. In the foregoing composition, $R_2O$ refers to the total amount of alkali metal oxides, such as $Li_2O$, $Na_2O$, $K_2O$, $Rb_2O$, and $Cs_2O$). In particular, $Na_2O$ may be present in an amount in a range from about from about 8 mol % to about 20 mol %, and $K_2O$ may be present in an amount in a range from about 0 mol % to about 4 mol %. Further, in the foregoing composition, RO refers to the total amount of alkaline earth metal oxide such, as CaO, MgO, BaO, ZnO and SrO. In particular, CaO may be present in an amount in a range of from about 0 mol % to about 1 mol %, and MgO may be present in an amount in a range of from about 0 mol % to about 7 mol %.

In embodiments, the glass composition may include other oxides of such metals as Ti, V, Cr, Mn, Fe, Co, Ni, Cu, Ce, W, and Mo. In particular, Fe in the form of $Fe_2O_3$ may be present in an amount in a range of from about 0 mol % to about 1 mol %, and $TiO_2$ may be present in an amount of in a range of about 0 mol % to about 5 mol %.

An exemplary glass composition includes $SiO_2$ in an amount in a range from about 65 mol % to about 75 mol %, $Al_2O_3$ in an amount in a range from about 8 mol % to about 14 mol %, $Na_2O$ in an amount in a range from about 12 mol % to about 17 mol %, $K_2O$ in an amount in a range of about 0 mol % to about 0.2 mol %, and MgO in an amount in a range of from about 1.5 mol % to about 6 mol %. Optionally, $SnO_2$ may be included in the amounts otherwise disclosed herein.

Aspect (1) of this disclosure pertains to a glass article, comprising: a glass sheet comprising a first major surface and a second major surface opposite to the first major surface; a hinge mechanism disposed on the second major surface of the glass sheet, the hinge mechanism dividing the glass sheet into a first side and a second side; a bendable display unit bonded to the second major surface of the glass sheet and disposed between the glass sheet and the hinge mechanism; an adhesive material disposed on the second major surface of the glass sheet around the display; wherein the first side is bendable about the hinge mechanism relative to the second side; and wherein the bendable display unit is hermetically sealed within the adhesive material.

Aspect (2) of this disclosure pertains to the glass article of Aspect (1), wherein the bendable display unit comprises a front display surface, a rear surface, and a peripheral surface connecting the front display surface and the rear surface and wherein the adhesive material is bonded to the peripheral surface and to the rear surface.

Aspect (3) of this disclosure pertains to the glass article of Aspect (2), wherein the front display surface is bonded to the second major surface of the glass sheet with an optically clear adhesive.

Aspect (4) of this disclosure pertains to the glass article of Aspect (2) or Aspect (3), further comprising at least one frame disposed on the second major surface of the glass sheet on a side of the hinge mechanism, wherein the adhesive material bonds the frame to the second major surface of the glass sheet and wherein the adhesive material is not bonded to the hinge mechanism in a region between the hinge mechanism and the bendable display unit.

Aspect (5) of this disclosure pertains to the glass article of Aspect (4), wherein the bendable display extends over the at least one frame.

Aspect (6) of this disclosure pertains to the glass article of Aspect (1), wherein the bendable display unit comprises a front display surface, a rear surface, and a peripheral surface connecting the front display surface and the rear surface and wherein a gap is provided between the adhesive material and the peripheral surface and the rear surface.

Aspect (7) of this disclosure pertains to the glass article of Aspect (6), further comprising an anti-splinter film bonded to the second major surface of the glass sheet around the bendable display unit.

Aspect (8) of this disclosure pertains to the glass article of Aspect (6) or Aspect (7), further comprising a spacer disposed on the rear surface of the bendable display unit.

Aspect (9) of this disclosure pertains to the glass article of Aspect (6) or Aspect (7), further comprising a spacer disposed around the peripheral surface of the bendable display unit.

Aspect (10) of this disclosure pertains to the glass article of Aspect (8) or Aspect (9), wherein the spacer comprises at least one of a rubber gasket, a honeycomb structure, or an air bladder.

Aspect (11) of this disclosure pertains to the glass article of any one of Aspects (6) through (10), wherein the bendable display unit extends past at least one side of the hinge mechanism.

Aspect (12) of this disclosure pertains to the glass article of any one of Aspects (6) through (11), further comprising a backing sheet disposed between the adhesive material and the hinge mechanism.

Aspect (13) of this disclosure pertains to the glass article of Aspect (12), wherein the backing plate comprises an aluminum alloy or a steel alloy.

Aspect (14) of this disclosure pertains to the glass article of any one of Aspects (6) through (13), further comprising at least one frame on a side of the hinge mechanism, wherein the adhesive material bonds to the at least one frame and to the second major surface of the glass sheet.

Aspect (15) of this disclosure pertains to the glass article of Aspect (14), wherein hinge mechanism comprises a protrusion, wherein the bendable display unit is in contact with the protrusion of the hinge mechanism.

Aspect (16) of this disclosure pertains to the glass article of Aspect (14), wherein the hinge mechanism comprises a recess, wherein the at least a portion of the peripheral surface of the bendable display unit is surrounded by the recess.

Aspect (17) of this disclosure pertains to the glass article of any one of Aspects (1) through (16), wherein the adhesive material comprises a polyurethane, a polyvinylchloride, or a reaction injection molding material.

Aspect (18) of this disclosure pertains to the glass article of any one of Aspects (1) through (17), wherein the hinge mechanism comprises an aluminum alloy or a steel alloy.

Aspect (19) of this disclosure pertains to the glass article of any one of Aspects (1) through (18), wherein the bendable display unit comprises at least one of an organic light emitting diode display, an organic liquid crystal display, or a micro-light emitting diode display.

Aspect (20) of this disclosure pertains to the glass article of any one of Aspects (1) through (19), wherein the first side is bendable from a planar configuration with respect to the second side to a bent configuration in which the first side bends 10° to 180° from planar.

Aspect (21) of this disclosure pertains to an interior system of a vehicle, comprising: a dashboard base positioned across a center line axis of the vehicle, the center line axis dividing the vehicle longitudinally into a driver side and a passenger side; a glass article attached to the dashboard base, the glass article comprising: a glass sheet comprising a first major surface and a second major surface opposite to the first major surface, wherein the first glass sheet comprises a first side and a second side, the first side being located on the driver side of the center line axis; a hinge mechanism disposed on the second major surface of the glass sheet, the hinge mechanism dividing the glass sheet between the first side and the second side; and a bendable display unit bonded to the second major surface of the glass sheet and disposed between the hinge mechanism and the glass sheet; an adhesive material disposed on the second major surface of the glass sheet around the bendable display unit; wherein the display is hermetically sealed between the adhesive material and the glass sheet; wherein the bendable display unit is configured to transition between a curved configuration and a planar configuration when the second side of the glass sheet bends about the hinge mechanism.

Aspect (22) of this disclosure pertains to the interior system of Aspect (21), wherein the bendable display unit comprises a front display surface, a rear surface, and a peripheral surface connecting the front display surface and the rear surface and wherein the adhesive material is bonded to the peripheral surface and to the rear surface.

Aspect (23) of this disclosure pertains to the interior system of Aspect (22), further comprising at least one frame disposed on the second major surface of the glass sheet on a side of the hinge mechanism, wherein the adhesive material bonds the frame to the second major surface of the glass sheet and wherein the adhesive material is not bonded to the hinge mechanism in a region between the hinge mechanism and the bendable display unit.

Aspect (24) of this disclosure pertains to the interior system of Aspect (23), wherein the bendable display extends over the at least one frame.

Aspect (25) of this disclosure pertains to the interior system of Aspect (22), wherein the bendable display unit comprises a front display surface, a rear surface, and a peripheral surface connecting the front display surface and the rear surface and wherein a gap is provided between the adhesive material and the peripheral surface and the rear surface.

Aspect (26) of this disclosure pertains to the interior system of Aspect (25), further comprising a spacer disposed on the rear surface of the bendable display unit.

Aspect (27) of this disclosure pertains to the interior system of Aspect (25), further comprising a spacer disposed around the peripheral surface of the bendable display unit.

Aspect (28) of this disclosure pertains to the interior system of any one of Aspects (25) through (27), wherein the bendable display unit extends past at least one side of the hinge mechanism.

Aspect (29) of this disclosure pertains to the interior system of any one of Aspects (25) through (28), further comprising a backing sheet disposed between the adhesive material and the hinge mechanism.

Aspect (30) of this disclosure pertains to the interior system of any one of Aspects (25) through (29), further comprising at least one frame on a side of the hinge mechanism, wherein the adhesive material bonds to the at least one frame and to the second major surface of the glass sheet.

Aspect (31) of this disclosure pertains to the interior system of Aspect (30), wherein hinge mechanism comprises a protrusion, wherein the bendable display unit is in contact with the protrusion of the hinge mechanism.

Aspect (32) of this disclosure pertains to the interior system of Aspect (30), wherein the hinge mechanism comprises a recess, wherein the at least a portion of the peripheral surface of the bendable display unit is surrounded by the recess.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is in no way intended that any particular order be inferred. In addition, as used herein, the article "a" is intended to include one or more than one component or element, and is not intended to be construed as meaning only one.

It will be apparent to those skilled in the art that various modifications and variations can be made without departing from the spirit or scope of the disclosed embodiments. Since modifications, combinations, sub-combinations and variations of the disclosed embodiments incorporating the spirit and substance of the embodiments may occur to persons skilled in the art, the disclosed embodiments should be construed to include everything within the scope of the appended claims and their equivalents.

What is claimed is:

1. A glass article, comprising:
    a glass sheet comprising a first major surface and a second major surface opposite to the first major surface;
    a hinge mechanism disposed on the second major surface of the glass sheet, the hinge mechanism dividing the glass sheet into a first side and a second side;
    a bendable display unit bonded to the second major surface of the glass sheet and disposed between the glass sheet and the hinge mechanism;
    an adhesive material disposed on the second major surface of the glass sheet around the display;
    wherein the first side is bendable about the hinge mechanism relative to the second side; and wherein the bendable display unit is hermetically sealed within the adhesive material.

2. The glass article of claim 1, wherein the bendable display unit comprises a front display surface, a rear surface, and a peripheral surface connecting the front display surface and the rear surface and wherein the adhesive material is bonded to the peripheral surface and to the rear surface.

3. The glass article of claim 2, further comprising at least one frame disposed on the second major surface of the glass sheet on a side of the hinge mechanism, wherein the adhesive material bonds the frame to the second major surface of the glass sheet and wherein the adhesive material is not bonded to the hinge mechanism in a region between the hinge mechanism and the bendable display unit.

4. The glass article of claim 3, wherein the bendable display extends over the at least one frame.

5. The glass article of claim 1, wherein the bendable display unit comprises a front display surface, a rear surface, and a peripheral surface connecting the front display surface and the rear surface and wherein a gap is provided between the adhesive material and the peripheral surface and the rear surface.

6. The glass article of claim 5, further comprising an anti-splinter film bonded to the second major surface of the glass sheet around the bendable display unit.

7. The glass article of claim 5, further comprising a spacer disposed on the rear surface of the bendable display unit or around the peripheral surface of the bendable display unit.

8. The glass article of claim 7, wherein the spacer comprises at least one of a rubber gasket, a honeycomb structure, or an air bladder.

9. The glass article of claim 5, further comprising a backing sheet disposed between the adhesive material and the hinge mechanism, wherein the backing plate comprises an aluminum alloy or a steel alloy.

10. The glass article of claim 5, further comprising at least one frame on a side of the hinge mechanism, wherein the adhesive material bonds to the at least one frame and to the second major surface of the glass sheet.

11. The glass article of claim 10, wherein;
hinge mechanism comprises a protrusion, wherein the bendable display unit is in contact with the protrusion of the hinge mechanism; or
the hinge mechanism comprises a recess, wherein the at least a portion of the peripheral surface of the bendable display unit is surrounded by the recess.

12. The glass article of claim 1, wherein the first side is bendable from a planar configuration with respect to the second side to a bent configuration in which the first side bends 10° to 180° from planar.

13. An interior system of a vehicle, comprising:
a dashboard base positioned across a center line axis of the vehicle, the center line axis dividing the vehicle longitudinally into a driver side and a passenger side;
a glass article attached to the dashboard base, the glass article comprising:
a glass sheet comprising a first major surface and a second major surface opposite to the first major surface, wherein the first glass sheet comprises a first side and a second side, the first side being located on the driver side of the center line axis;
a hinge mechanism disposed on the second major surface of the glass sheet, the hinge mechanism dividing the glass sheet between the first side and the second side; and
a bendable display unit bonded to the second major surface of the glass sheet and disposed between the hinge mechanism and the glass sheet;
an adhesive material disposed on the second major surface of the glass sheet around the bendable display unit;
wherein the display is hermetically sealed between the adhesive material and the glass sheet; and
wherein the bendable display unit is configured to transition between a curved configuration and a planar configuration when the second side of the glass sheet bends about the hinge mechanism.

14. The interior system of claim 13, wherein the bendable display unit comprises a front display surface, a rear surface, and a peripheral surface connecting the front display surface and the rear surface and wherein the adhesive material is bonded to the peripheral surface and to the rear surface.

15. The interior system of claim 14, further comprising at least one frame disposed on the second major surface of the glass sheet on a side of the hinge mechanism, wherein the adhesive material bonds the frame to the second major surface of the glass sheet and wherein the adhesive material is not bonded to the hinge mechanism in a region between the hinge mechanism and the bendable display unit.

16. The interior system of claim 15, wherein the bendable display extends over the at least one frame.

17. The interior system of claim 14, wherein the bendable display unit comprises a front display surface, a rear surface, and a peripheral surface connecting the front display surface and the rear surface and wherein a gap is provided between the adhesive material and the peripheral surface and the rear surface.

18. The interior system of claim 17, further comprising a spacer disposed on the rear surface of the bendable display unit or around the peripheral surface of the bendable display unit.

19. The interior system of claim 17, further comprising at least one frame on a side of the hinge mechanism, wherein the adhesive material bonds to the at least one frame and to the second major surface of the glass sheet.

20. The interior system of claim 19, wherein;
the hinge mechanism comprises a protrusion, wherein the bendable display unit is in contact with the protrusion of the hinge mechanism; or
the hinge mechanism comprises a recess, wherein the at least a portion of the peripheral surface of the bendable display unit is surrounded by the recess.

* * * * *